(12) United States Patent
Hu et al.

(10) Patent No.: US 11,645,969 B2
(45) Date of Patent: *May 9, 2023

(54) DISPLAY DEVICE, GATE DRIVE CIRCUIT, SHIFT REGISTER AND CONTROL METHOD THEREOF

(71) Applicants: HEFEI BOE DISPLAY TECHNOLOGY CO., LTD., Anhui (CN); BOE TECHNOLOGY GROUP CO., LTD., Beijing (CN)

(72) Inventors: Zuquan Hu, Beijing (CN); Zhenyu Zhang, Beijing (CN); Haipeng Yang, Beijing (CN); Ke Dai, Beijing (CN)

(73) Assignees: HEFEI BOE DISPLAY TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/809,234

(22) Filed: Jun. 27, 2022

(65) Prior Publication Data

US 2022/0327988 A1 Oct. 13, 2022

Related U.S. Application Data

(63) Continuation of application No. 16/473,076, filed as application No. PCT/CN2019/070993 on Jan. 9, 2019, now Pat. No. 11,443,682.

(30) Foreign Application Priority Data

May 25, 2018 (CN) .......................... 201810514974.X

(51) Int. Cl.
*G09G 3/20* (2006.01)
*G09G 3/3266* (2016.01)
(Continued)

(52) U.S. Cl.
CPC ........... *G09G 3/2092* (2013.01); *G09G 3/325* (2013.01); *G09G 3/3266* (2013.01);
(Continued)

(58) Field of Classification Search
CPC .... G09G 3/2092; G09G 3/325; G09G 3/3266; G09G 2300/0408; G09G 2300/0426;
(Continued)

(56) References Cited

U.S. PATENT DOCUMENTS 9,881,543 B2   1/2018  Ma
11,443,682 B2* 9/2022  Hu ........................ G09G 3/2092
(Continued)

FOREIGN PATENT DOCUMENTS

CN    104900189 A    9/2015
CN    105957470 A    9/2016
(Continued)

OTHER PUBLICATIONS

ISR and Written Opinion dated Feb. 27, 2019: PCT/CN2019/070993.
(Continued)

*Primary Examiner* — Adam J Snyder

(57) ABSTRACT

A display device, a gate drive circuit, a shift register and a control method are disclosed. The shift register includes a first shift register unit and a second shift register unit, the first shift register unit is configured to write a first control signal to the first node, and write a first clock signal to the first signal output terminal under control of a voltage of the first node; the second shift register unit is configured to write a second clock signal to the second signal output terminal under control of the voltage of the first node; during time of a frame, the first clock signal and a first input signal provided by a first signal input terminal are pulse signals, and the second clock signal is a DC signal.

20 Claims, 12 Drawing Sheets

(51) Int. Cl.
*G11C 19/28* (2006.01)
*G09G 3/325* (2016.01)

(52) U.S. Cl.
CPC .............. *G09G 2300/0408* (2013.01); *G09G 2300/0426* (2013.01); *G09G 2300/0852* (2013.01); *G09G 2300/0861* (2013.01); *G09G 2310/0286* (2013.01); *G09G 2310/061* (2013.01); *G09G 2310/08* (2013.01); *G09G 2320/045* (2013.01); *G09G 2340/16* (2013.01); *G11C 19/28* (2013.01)

(58) Field of Classification Search
CPC ... G09G 2300/0852; G09G 2300/0861; G09G 2310/0286; G09G 2310/061; G09G 2310/08; G09G 2320/045; G09G 2340/16; G11C 19/28
See application file for complete search history.

(56) References Cited

U.S. PATENT DOCUMENTS

| 2006/0097965 | A1 | 5/2006 | Deane et al. |
| 2007/0104307 | A1 | 5/2007 | Kim et al. |
| 2018/0336957 | A1 | 11/2018 | Mi et al. |

FOREIGN PATENT DOCUMENTS

| CN | 106157912 A1 | 11/2016 |
| CN | 106548740 A | 3/2017 |
| CN | 108735162 A | 11/2018 |
| JP | 08190365 A | 7/1996 |

OTHER PUBLICATIONS

USPTO NFOA dated Dec. 7, 2021 in connection with U.S. Appl. No. 16/473,076.
USPTO NOA dated May 4, 2022 in connection with U.S. Appl. No. 16/473,076.

* cited by examiner

DISPLAY DEVICE, GATE DRIVE CIRCUIT, SHIFT REGISTER AND CONTROL METHOD THEREOF

The present application is a continuation application of U.S. patent applicant Ser. No. 16/473,076 filed on Jun. 24, 2019, which is a U.S. National Phase Entry of International Applicant No. PCT/CN2019/070993 filed Jan. 9, 2019. The above-identified applications are incorporated by reference herein in their entirety.

TECHNICAL FIELD

The embodiments of the present disclosure relate to a shift register, a gate drive circuit, a display device and a control method of a shift register.

BACKGROUND

With the progress of display technology, more and more Active Matrix Organic Light Emitting Diode (AMOLED) panels have entered the market. Compared with traditional thin film transistor liquid crystal display (TFT LCD) panels, AMOLED panels have faster response speed, higher contrast ratio, wider viewing angle and thinner module, so AMOLED panels have attracted more and more attention from panel manufacturers.

SUMMARY

Some embodiments of the present disclosure provide a shift register comprising a first shift register unit and a second shift register unit, the first shift register unit is electrically connected with a first node, a first signal input terminal, a first clock signal terminal, and a first signal output terminal, and the second shift register unit is electrically connected with the first node, a second signal input terminal, a second clock signal terminal, and a second signal output terminal. The first shift register unit is configured to write a first control signal to the first node under control of a first input signal provided by the first signal input terminal, and write a first clock signal provided by the first clock signal terminal to the first signal output terminal under control of a voltage of the first node; the second shift register unit is configured to write a second control signal to the first node under control of a second input signal provided by the second signal input terminal, and write a second clock signal provided by the second clock signal terminal to the second signal output terminal under control of the voltage of the first node; any two adjacent frames comprise a first frame and a second frame, during time of the first frame, the first clock signal and the first input signal are pulse signals, and the second clock signal and the second input signal are DC signals; during time of the second frame, the first clock signal and the first input signal are DC signals, and the second clock signal and the second input signal are pulse signals.

For example, in the shift register provided by some embodiments of the present disclosure, the first shift register unit comprises a first input circuit and a first output circuit, the second shift register unit comprises a second input circuit and a second output circuit, the first input circuit is respectively connected with the first signal input terminal and the first node, and the first input circuit is configured to write the first input signal to the first node under control of the first input signal provided by the first signal input terminal; the first output circuit is respectively connected with the first node, the first clock signal terminal, and the first signal output terminal, and the first output circuit is configured to write a voltage of the first clock signal terminal to the first signal output terminal under control of the voltage of the first node; the second input circuit is respectively connected with the second signal input terminal and the first node, and the second input circuit is configured to write the second input signal to the first node under control of the second input signal provided by the second signal input terminal; and the second output circuit is respectively connected with the first node, the second clock signal terminal, and the second signal output terminal, and the second output circuit is configured to write a voltage of the second clock signal terminal to the second signal output terminal under control of the voltage of the first node.

For example, in the shift register provided by some embodiments of the present disclosure, the first shift register unit further comprises a first control circuit, and the second shift register unit further comprises a second control circuit, the first control circuit is respectively connected with a first power supply terminal, the first node, a first reset signal terminal, a third power supply terminal, and the first signal output terminal, and the first control circuit is configured to control a voltage of the first signal output terminal and the voltage of the first node under control of a first control voltage provided by the first power supply terminal and a first reset voltage provided by the first reset signal terminal; the second control circuit is respectively connected with a second power supply terminal, the first node, a second reset signal terminal, the third power supply terminal, and the second signal output terminal, and the second control circuit is configured to control a voltage of the second signal output terminal and the voltage of the first node under control of a second control voltage provided by the second power supply terminal and a second reset voltage provided by the second reset signal terminal; during the time of the first frame, the first power supply terminal outputs the first control voltage, and during the time of the second frame, the second power supply terminal outputs the second control voltage.

For example, in the shift register provided by some embodiments of the present disclosure, both the first control voltage and the second control voltage have high levels.

For example, in the shift register provided by some embodiments of the present disclosure, the first control circuit comprises a first pull-down control circuit and a first pull-down circuit, the first pull-down control circuit is connected with the first node and the second node respectively, and is configured to control a level of the second node under control of the voltage of the first node, the first pull-down circuit is connected with the first node, the second node, the third power supply terminal, and the first signal output terminal respectively, and is configured to perform discharge process on the first node and the first signal output terminal under control of a voltage of the second node.

For example, in the shift register provided by some embodiments of the present disclosure, the first pull-down control circuit is further connected with the first power supply terminal and the third power supply terminal, respectively, and the first pull-down control circuit is configured to write the first control voltage to the second node under control of the first control voltage and write a voltage of the third power supply terminal to the second node under control of the voltage of the first node.

For example, in the shift register provided by some embodiments of the present disclosure, the first control circuit further comprises a first reset circuit, the first reset circuit is respectively connected with the first reset signal terminal, the third power supply terminal, and the first node, and the first reset circuit is configured to write a voltage of the third power supply terminal to the first node under control of the first reset voltage.

For example, in the shift register provided by some embodiments of the present disclosure, the first pull-down circuit is further connected with the third node and the second signal output terminal, and the first pull-down circuit is further configured to perform discharge process on the third node and the second signal output terminal under control of the voltage of the second node.

For example, in the shift register provided by some embodiments of the present disclosure, the second control circuit comprises a second pull-down control circuit and a second pull-down circuit, the second pull-down control circuit is connected with the first node and a third node respectively, and is configured to control a level of the third node under control of the voltage of the first node, the second pull-down circuit is connected with the first node, the third node, the third power supply terminal, and the second signal output terminal respectively, and is configured to perform discharge process on the first node and the second signal output terminal under control of a voltage of the third node.

For example, in the shift register provided by some embodiments of the present disclosure, the second pull-down control circuit is further connected with the second power supply terminal and the third power supply terminal, respectively, and the second pull-down control circuit is configured to write the second control voltage to the third node under control of the second control voltage and write the voltage of the third power supply terminal to the third node under control of the voltage of the first node.

For example, in the shift register provided by some embodiments of the present disclosure, the second control circuit further comprises a second reset circuit, the second reset circuit is respectively connected with the second reset signal terminal, the third power supply terminal, and the first node, and the second reset circuit is configured to write the voltage of the third power supply terminal to the first node under control of the second reset voltage.

For example, in the shift register provided by some embodiments of the present disclosure, the second pull-down circuit is further connected with the second node and the first signal output terminal, and the second pull-down circuit is further configured to perform discharge process on the second node and the first signal output terminal under control of the voltage of the third node.

For example, in the shift register provided by some embodiments of the present disclosure, the first shift register unit further comprises a first control circuit, and the second shift register unit further comprises a second control circuit, the first control circuit is respectively connected with a first power supply terminal, the first node, a first reset signal terminal, a third power supply terminal, and the first signal output terminal, and the first control circuit is configured to control a voltage of the first signal output terminal and the voltage of the first node under control of a first control voltage provided by the first power supply terminal and a first reset voltage provided by the first reset signal terminal, the second control circuit is respectively connected with the first power supply terminal, the first node, a second reset signal terminal, the third power supply terminal, and the second signal output terminal, and the second control circuit is configured to control a voltage of the second signal output terminal and the voltage of the first node under control of the first control voltage provided by the first power supply terminal and a second reset voltage provided by the second reset signal terminal; the first power supply terminal outputs the first control voltage during the time of the first frame and the time of the second frame.

For example, in the shift register provided by some embodiments of the present disclosure, the first control circuit comprises a first pull-down control circuit, a first pull-down circuit, and a first reset circuit, the first pull-down control circuit is respectively connected with the first node and a second node, and is configured to control a level of the second node under control of the voltage of the first node; the first pull-down circuit is respectively connected with the first node, the second node, the third power supply terminal, and the first signal output terminal, and is configured to perform discharge process on the first node and the first signal output terminal under control of a voltage of the second node; and the first reset circuit is respectively connected with the first reset signal terminal, the third power supply terminal, and the first node, and the first reset circuit is configured to write a voltage of the third power supply terminal to the first node under control of the first reset voltage.

For example, in the shift register provided by some embodiments of the present disclosure, the second control circuit comprises the first pull-down control circuit, the first pull-down circuit, and a second reset circuit, the first pull-down circuit is further connected with the second signal output terminal and is further configured to perform discharge process on the second signal output terminal under control of the voltage of the second node; and the second reset circuit is respectively connected with the second reset signal terminal, the third power supply terminal, and the first node, and the second reset circuit is configured to write the voltage of the third power supply terminal to the first node under control of the second reset voltage.

For example, in the shift register provided by some embodiments of the present disclosure, the first pull-down control circuit is further connected with the first power supply terminal and the third power supply terminal, respectively, and the first pull-down control circuit is configured to write the first control voltage to the second node under control of the first control voltage and write the voltage of the third power supply terminal to the second node under control of the voltage of the first node.

For example, in the shift register provided by some embodiments of the present disclosure, the first input circuit comprises a first transistor, a first electrode and a control electrode of the first transistor are connected with the first signal input terminal to receive the first input signal as the first control signal, and a second electrode of the first transistor is connected with the first node; the second input circuit comprises a second transistor, a first electrode and a control electrode of the second transistor are connected with the second signal input terminal to receive the second input signal as the second control signal, and a second electrode of the second transistor is connected with the first node.

For example, in the shift register provided by some embodiments of the present disclosure, the first output circuit comprises a third transistor and a first capacitor, a first electrode of the third transistor is connected with the first clock signal terminal, a second electrode of the third transistor is connected with the first signal output terminal, a control electrode of the third transistor is connected with the first node, a first end of the first capacitor is connected with the first node, and a second end of the first capacitor is connected with the first signal output terminal; the second output circuit comprises a fourth transistor and a second capacitor, a first electrode of the fourth transistor is connected with the second clock signal terminal, a second electrode of the fourth transistor is connected with the second signal output terminal, a control electrode of the fourth transistor is connected with the first node, a first end of the second capacitor is connected with the first node, and a second end of the second capacitor is connected with the second signal output terminal.

For example, in the shift register provided by some embodiments of the present disclosure, the first pull-down control circuit comprises a seventh transistor and an eighth transistor, a first electrode and a control electrode of the seventh transistor are connected with the first power supply terminal, a second electrode of the seventh transistor is connected with the second node, a first electrode of the eighth transistor is connected with the third power supply terminal, a second electrode of the eighth transistor is connected with the second node, and a control electrode of the eighth transistor is connected with the first node; the first pull-down circuit comprises an eleventh transistor and a twelfth transistor, a first electrode of the eleventh transistor is connected with the first node, a second electrode of the eleventh transistor is connected with the third power supply terminal, a control electrode of the eleventh transistor is connected with the second node, a first electrode of the twelfth transistor is connected with the first signal output terminal, a second electrode of the twelfth transistor is connected with the third power supply terminal, and a control electrode of the twelfth transistor is connected with the second node.

For example, in the shift register provided by some embodiments of the present disclosure, the first pull-down circuit further comprises a fifteenth transistor and a sixteenth transistor, a first electrode of the fifteenth transistor is connected with the third node, a second electrode of the fifteenth transistor is connected with the third power supply terminal, a control electrode of the fifteenth transistor is connected with the second node, a first electrode of the sixteenth transistor is connected with the second signal output terminal, a second electrode of the sixteenth transistor is connected with the third power supply terminal, and a control electrode of the sixteenth transistor is connected with the second node.

For example, in the shift register provided by some embodiments of the present disclosure, the first reset circuit comprises a fifth transistor, a first electrode of the fifth transistor is connected with the first node, a second electrode of the fifth transistor is connected with the third power supply terminal, and a control electrode of the fifth transistor is connected with the first reset signal terminal.

For example, in the shift register provided by some embodiments of the present disclosure, the second pull-down control circuit comprises a ninth transistor and a tenth transistor, a first electrode and a control electrode of the ninth transistor are connected with the second power supply terminal, a second electrode of the ninth transistor is connected with the third node, a first electrode of the tenth transistor is connected with the third power supply terminal, a second electrode of the tenth transistor is connected with the third node, and a control electrode of the tenth transistor is connected with the first node; the second pull-down circuit comprises a thirteenth transistor and a fourteenth transistor, a first electrode of the thirteenth transistor is connected with the first node, a second electrode of the thirteenth transistor is connected with the third power supply terminal, a control electrode of the thirteenth transistor is connected with the third node, a first electrode of the fourteenth transistor is connected with the second signal output terminal, a second electrode of the fourteenth transistor is connected with the third power supply terminal, and a control electrode of the fourteenth transistor is connected with the third node.

For example, in the shift register provided by some embodiments of the present disclosure, the second pull-down circuit further comprises a seventeenth transistor and an eighteenth transistor, a first electrode of the seventeenth transistor is connected with the second node, a second electrode of the seventeenth transistor is connected with the third power supply terminal, a control electrode of the seventeenth transistor is connected with the third node, a first electrode of the eighteenth transistor is connected with the first signal output terminal, a second electrode of the eighteenth transistor is connected with the third power supply terminal, and a control electrode of the eighteenth transistor is connected with the third node.

For example, in the shift register provided by some embodiments of the present disclosure, the second reset circuit comprises a sixth transistor, a first electrode of the sixth transistor is connected with the first node, a second electrode of the sixth transistor is connected with the third power supply terminal, and a control electrode of the sixth transistor is connected with the second reset signal terminal.

Some embodiments of the present disclosure further provide a gate drive circuit comprising the shift register provided in any one of the above embodiments.

For example, in the gate drive circuit provided by some embodiments of the present disclosure, the plurality of cascaded shift registers constitute a plurality of gate drive circuit groups, each gate drive circuit group comprises 2P shift registers, the 2P shift registers in each gate drive circuit group correspond to 2P clock signal groups, and two clock signals in each clock signal group are respectively provided to a first clock signal terminal and a second clock signal terminal of a corresponding shift register, in a case of P=1, a first signal input terminal of a j-th stage shift register is connected with a first signal output terminal of a (j−1)-th stage shift register, a second signal input terminal of the j-th stage shift register is connected with a second signal output terminal of the (j−1)-th stage shift register, a first reset signal terminal of the j-th stage shift register is connected with a first signal output terminal of a (j+1)-th stage shift register, and a second reset signal terminal of the j-th stage shift register is connected with a second signal output of the (j+1)-th stage shift register; in a case where P is greater than 1, a first signal input terminal of a j-th stage shift register is connected with a first signal output terminal of a (j−P)-th stage shift register, a second signal input terminal of the j-th stage shift register is connected with a second signal output terminal of the (j−P)-th stage shift register, a first reset signal terminal of the j-th stage shift register is connected with a first signal output terminal of a (j+P+1)-th stage shift register, and a second reset signal terminal of the j-th stage shift register is connected with a second signal output terminal of the (j+P+1)-th stage shift register, P is a positive integer and j is an integer greater than P.

Some embodiments of the present disclosure further provide a display device comprising the gate drive circuit provided in any one of the above embodiments.

Some embodiments of the present disclosure further provide a control method of the shift register according to any one of the above embodiments, comprising: during time of the first frame, writing the first control signal to the first node through the first shift register unit under control of the first input signal, and writing the first clock signal to the first signal output terminal through the first shift register unit under control of the voltage of the first node, in which the first clock signal and the first input signal are pulse signals; during the time of the second frame, writing the second control signal to the first node through the second shift register unit under control of the second input signal, and writing the second clock signal to the second signal output terminal through the second shift register unit under control of the voltage of the first node, in which the second clock signal and the second input signal are pulse signals.

For example, in the control method of the shift register provided by some embodiments of the present disclosure, the time of the first frame comprises a first input phase, a first output phase, and a first discharge phase, and the time of the second frame comprises a second input phase, a second output phase, and a second discharge phase. The control method comprises: in the first input phase, the first signal input terminal outputting the first input signal, and the first input circuit writing the first control signal to the first node under control of the first input signal; in the first output phase, the first clock signal terminal outputting the first clock signal, and the first output circuit outputting the first clock signal to the first signal output terminal under control of the voltage of the first node; in the first discharge phase, the first reset signal terminal outputting the first reset voltage, the first power supply terminal outputting the first control voltage, and under control of the first reset voltage and the first control voltage, writing a voltage of the third power terminal to the first node and the first signal output terminal respectively through the first control circuit; in the second input phase, the second signal input terminal outputting the second input signal, and the second input circuit writing the second control signal to the first node under control of the second input signal; in the second output phase, the second clock signal terminal outputting the second clock signal, and the second output circuit outputting the second clock signal to the second signal output terminal under control of the voltage of the first node; in the second discharge phase, the second reset signal terminal outputting the second reset voltage, the second power terminal outputting the second control voltage, and under control of the second reset voltage and the second control voltage, writing the voltage of the third power terminal to the first node and the second signal output terminal respectively through the second control circuit.

BRIEF DESCRIPTION OF THE DRAWINGS

In order to clearly illustrate the technical solution of the embodiments of the present disclosure, the drawings of the embodiments will be briefly described in the following; it is obvious that the described drawings are only related to some embodiments of the present disclosure and thus are not limitative of the present disclosure.

DETAILED DESCRIPTION

In order to make objects, technical solutions and advantages of the embodiments of the present disclosure apparent, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

In order to keep the following description of embodiments of the present disclosure clear and concise, detailed descriptions of some known functions and known components are omitted in the present disclosure.

As for a case of the threshold voltage drift of a drive transistor, an AMOLED (Active Matrix Organic Light Emitting Diode) pixel circuit can adopt two sub-pixel circuits to reduce the threshold voltage drift of the drive transistor.

Each sub-pixel circuit comprises two thin film transistors (a drive transistor and a data writing transistor) and a capacitor. In adjacent frames, the drive transistors in the two sub-pixel circuits are turned on alternately, thus reducing the bias time of each drive transistor and reducing the threshold voltage drift of the drive transistor. However, the existing gate drive circuit cannot achieve the driving timing required for the pixel circuit.

The following is a brief introduction to an AMOLED pixel circuit.

Figure 1:
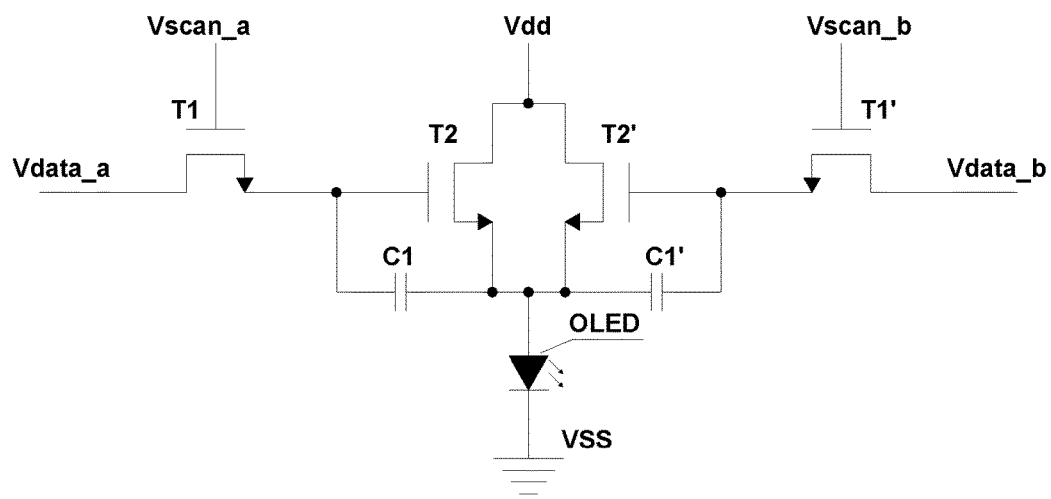
FIG. 1 is a circuit diagram of a pixel circuit.

As shown in FIG. 1, the AMOLED pixel circuit can adopt two sub-pixel circuits to reduce the threshold voltage drift of the drive transistor, the two sub-pixel circuits are a first sub-pixel circuit and a second sub-pixel circuit, respectively, the first sub-pixel circuit comprises a first drive transistor T2, a first data writing transistor T1, and a first storage capacitor C1, and the second sub-pixel circuit comprises a second drive transistor T2', a second data writing transistor T1', and a second storage capacitor C1'. During multi-frame time, the first sub-pixel circuit and the second sub-pixel circuit operate alternately, i.e. in one frame time, the first sub-pixel circuit operates, that is, the first drive transistor T2, the first data writing transistor T1, and the first storage capacitor C1 in FIG. 1 operate, at this time, the second sub-pixel circuit does not operate, that is, the second drive transistor T2', the second data writing transistor T1', and the second storage capacitor C1' in FIG. 1 do not operate. During another frame time, the second sub-pixel circuit operates, i.e. the second drive transistor T2', the second data writing transistor T1', and the second storage capacitor C1' in FIG. 1 operate, and the first sub-pixel circuit does not operate, that is, the first drive transistor T2, the first data writing transistor T1, and the first storage capacitor C1 in FIG. 1 do not operate.

Figure 2:
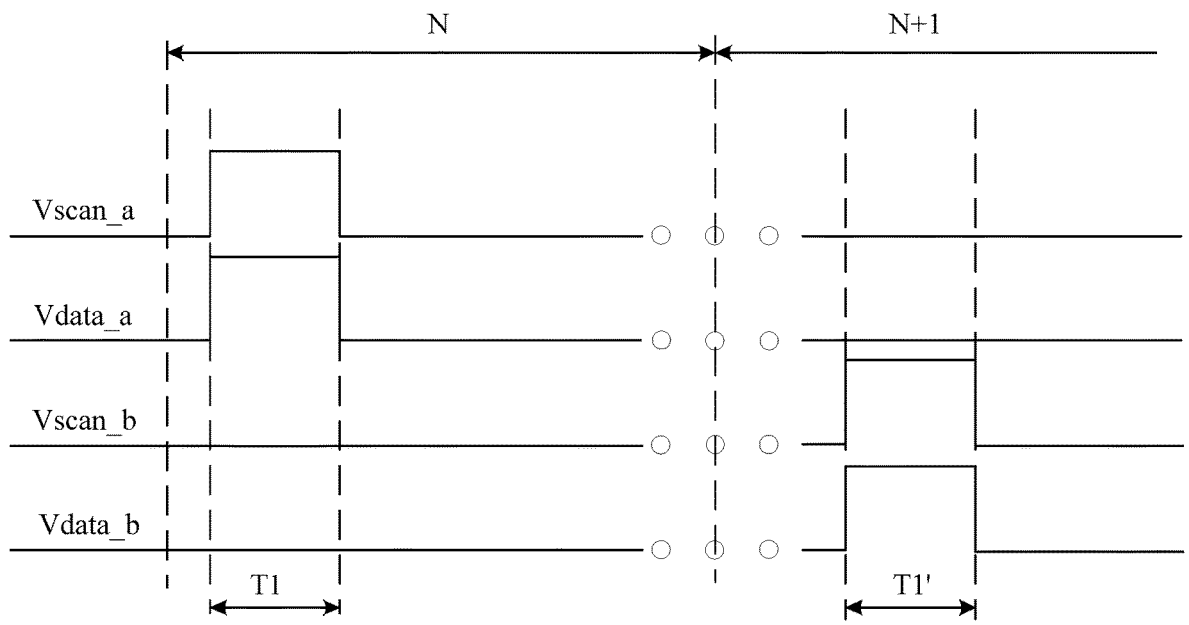
FIG. 2 is a schematic diagram of a driving timing of the pixel circuit shown in FIG. 1.

The driving timing of the pixel circuit in FIG. 1 can be shown in FIG. 2, during a T1 period of an n-th frame, a first scan signal Vscan_a and a first data signal Vdata_a are at a high level, thereby, the first data writing transistor T1 is turned on and the first data signal Vdata_a is written to a gate electrode of the first drive transistor T2. At this time, a second scan signal Vscan_b and a second data signal Vdata_b are at a low level, thereby, the second data writing transistor T1' is turned off; therefore, in a subsequent period of the n-th frame, the first drive transistor T2 is turned on, and the second drive transistor T2' is turned off and is in a threshold voltage recovery period. During a T1' period of a (N+1)-th frame, the second scan signal Vscan_b and the second data signal Vdata_b are at a high level, thereby, the second data writing transistor T1' is turned on and the second data signal Vdata_b is written to a gate electrode of the second drive transistor T2'. At this time, the first scan signal Vscan_a and the first data signal Vdata_a are at a low level, thereby, the first data writing transistor T1 is turned off; therefore, in a subsequent period of time of the (N+1)-th frame time, the second drive transistor T2' is turned on, the first drive transistor T2 is turned off and is in a threshold voltage recovery period. Thus, in adjacent frames, the first drive transistor T2 and the second drive transistor T2' are turned on alternately, which will greatly reduce the bias time of the drive transistor, thereby greatly reducing the threshold voltage drift of the drive transistor.

A gate drive circuit GOA (Gate Driver On Array) can not only omit the gate drive integrated circuit (IC) and a corresponding bonding process, but also achieve a narrow frame design of the display panel. Therefore, GOA has been more and more widely used in the design and production of the display panel.

Based on the above, the present disclosure provides a shift register and a control method thereof, a gate drive circuit and a display device, so that different drive transistors are alternately turned on at different frames, the threshold voltage drift of the drive transistor is reduced, and the requirement of optimizing the drive timing can be achieved; overall, the number of transistors used is small, so that the shift register is simpler to implement, and the cost can be reduced at the same time.

For example, in the present disclosure, a first to eighteenth transistors and the like may be field effect transistors. According to the characteristics of the field effect transistors, the field effect transistors can be divided into N-type transistors and P-type transistors. For the sake of clarity, the embodiments of the present disclosure illustrate the technical solution of the present disclosure in detail by taking field effect transistors as N-type transistors (e.g., N-type MOS transistors (NMOS)) as an example. However, the field effect transistors of the embodiments of the present disclosure are not limited to the N-type transistors, and those skilled in the art can also utilize P-type transistors (e.g., P-type MOS transistors (PMOS)) to implement the functions of one or more field effect transistors in the embodiments of the present disclosure according to actual needs.

It should be noted that the field effect transistors used in the embodiments of the present disclosure may be field effect transistors such as thin film transistors or other switching devices with the same characteristics, and the thin film transistors may include oxide semiconductor thin film transistors, amorphous silicon thin film transistors, polysilicon thin film transistors, or the like. A source electrode and a drain electrode of a field effect transistor can be symmetrical in structures, and therefore the source electrode and the drain electrode of the field effect transistor can be indistinguishable in physical structures. In the embodiments of the present disclosure, in order to distinguish two electrodes of the field effect transistor except a gate electrode as a control electrode, one of the two electrode is directly described as a first electrode and the other of the two electrodes is described as a second electrode, so the first electrode and the second electrode of all or part of the field effect transistors in the embodiment of the present disclosure are interchangeable as required.

A display device, a gate drive circuit, and a shift register and a control method thereof according to an embodiment of the present disclosure will be described below with reference to the accompanying drawings.

Figure 3A:
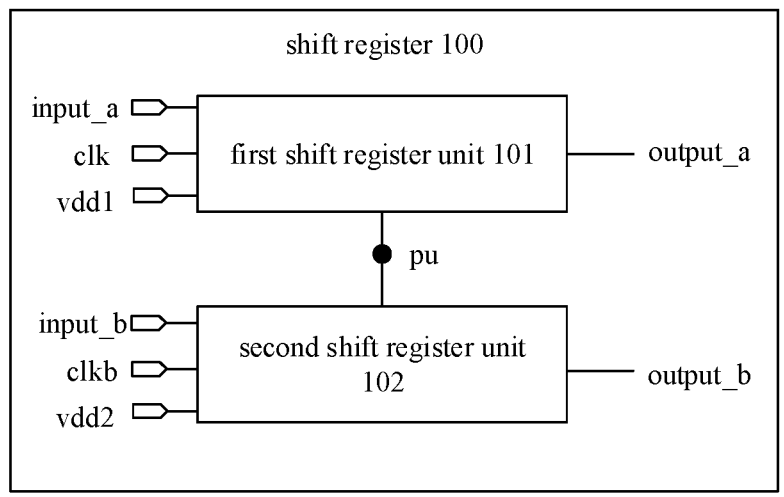
FIG. 3A is a block schematic diagram of a shift register according to some embodiments of the present disclosure.
Figure 3B:
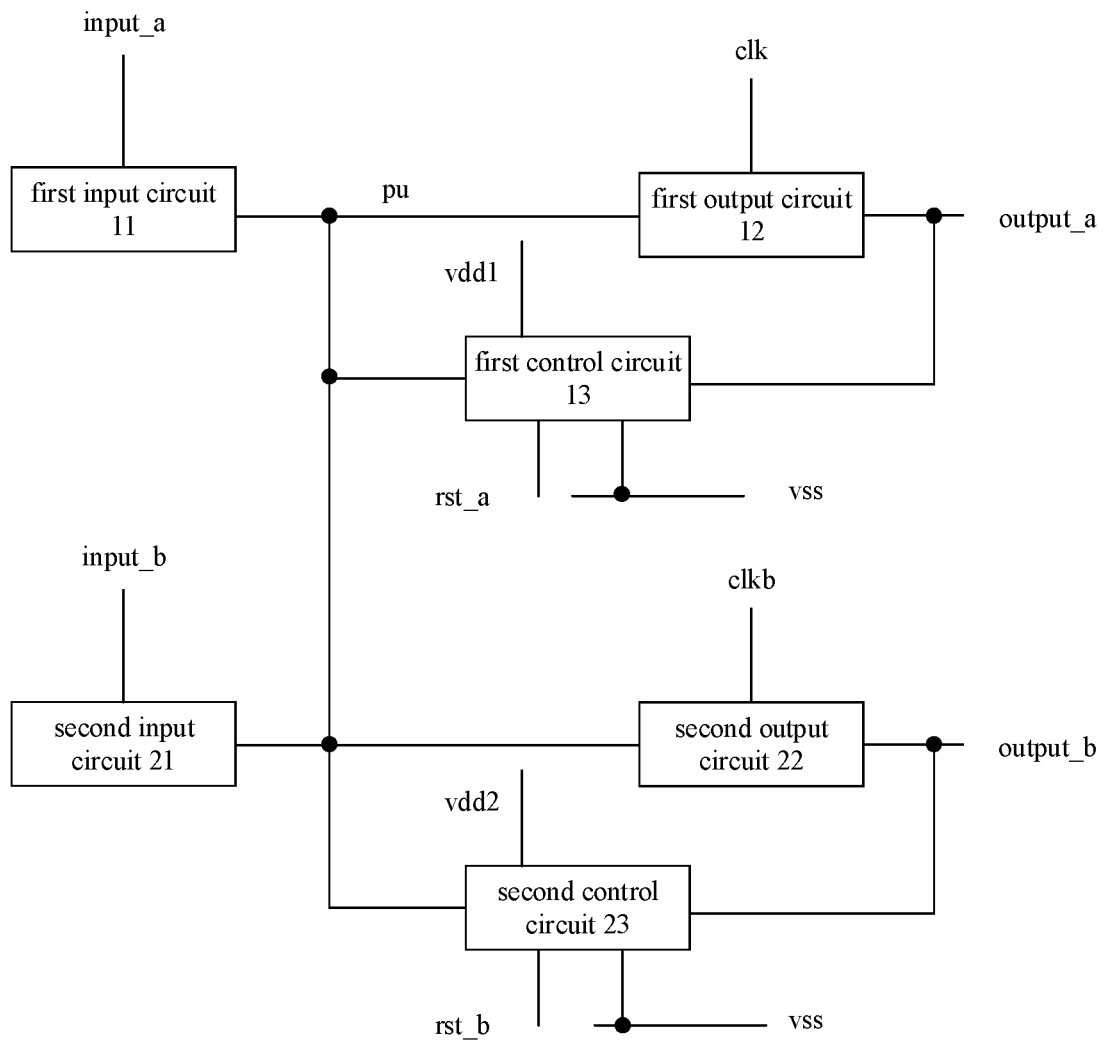
FIG. 3B is a block schematic diagram of another shift register according to some embodiments of the present disclosure.

FIG. 3A is a block schematic diagram of a shift register provided according to some embodiments of the present disclosure, and FIG. 3B is a block schematic diagram of another shift register provided according to some embodiments of the present disclosure. As shown in FIG. 3A, a shift register 100 includes a first shift register unit 101 and a second shift register unit 102. The first shift register unit 101 is electrically connected with a first node pu, a first signal input terminal input_a, a first clock signal terminal clk, and a first signal output terminal output_a, and the second shift register unit 102 is electrically connected with the first node pu, a second signal input terminal input_b, a second clock signal terminal clkb, and a second signal output terminal output_b.

For example, the first shift register unit 101 is configured to write a first control signal to the first node pu under control of a first input signal provided by the first signal input terminal input_a, and write a first clock signal provided by the first clock signal terminal clk to the first signal output terminal output_a under control of a voltage of the first node pu. The second shift register unit 102 is configured to write a second control signal to the first node pu under control of a second input signal provided by the second signal input terminal input_b, and write a second clock signal provided by the second clock signal terminal clkb to the second signal output terminal output_b under control of the voltage of the first node pu.

For example, any two adjacent frames include a first frame and a second frame. During time of the first frame, the first clock signal and the first input signal are pulse signals, and the second clock signal and the second input signal are DC (direct current) signals. During time of the second frame, the first clock signal and the first input signal are DC signals, and the second clock signal and the second input signal are pulse signals. That is, in multi-frame time, the first clock signal terminal clk alternately outputs pulse signals and DC signals, the first signal input terminal input_a alternately outputs pulse signals and DC signals, correspondingly, the second clock signal terminal clkb also alternately outputs DC signals and pulse signals, and the second signal input terminal input_b also alternately outputs DC signals and pulse signals. For example, in a 2m-th frame (even frame), the first clock signal terminal clk outputs a pulse signal, the first signal input terminal input_a outputs a pulse signal, the second clock signal terminal clkb outputs a DC signal, and the second signal input terminal input_b outputs a DC signal; in the (2m−1)-th frame (odd frame), the first clock signal terminal clk outputs a DC signal, the first signal input terminal input_a outputs a DC signal, the second clock signal terminal clkb outputs a pulse signal, and the second signal input terminal input_b outputs a pulse signal, where m is a positive integer.

For example, the DC signal may be a low level DC signal.

For example, as shown in FIG. 3B, in some embodiments, the first shift register unit 101 includes a first input circuit 11, a first output circuit 12, and a first control circuit 13, the first input circuit 11 is connected with the first signal input terminal input_a and the first node pu, respectively, and the first input circuit 11 is configured to write the first control signal to the first node pu under control of the first input signal provided by the first signal input terminal input_a; the first output circuit 12 is respectively connected with the first node pu, the first clock signal terminal clk, and the first signal output terminal output_a, the first output circuit 12 is configured to write the first clock signal provided by the first clock signal terminal clk to the first signal output terminal output_a under the control of the voltage of the first node pu; the first control circuit 13 is respectively connected with the first power supply terminal vdd1, the first node pu, a first reset signal terminal rst_a, a third power supply terminal vss, and the first signal output terminal output_a, the first control circuit 13 is configured to control a voltage of the first signal output terminal output_a and the voltage the first node pu under the control of a first control voltage provided by the first power supply terminal vdd1 and a first reset voltage provided by the first reset signal terminal rst_a.

For example, the second shift register unit 102 includes a second input circuit 21, a second output circuit 22, and a second control circuit 23. The second input circuit 21 is respectively connected with the second signal input terminal input_b and the first node pu, and the second input circuit 21 is configured to write the second control signal to the first node pu under the control of the second input signal provided by the second signal input terminal input_b; the second output circuit 22 is respectively connected with the first node pu, the second clock signal terminal clkb, and the second signal output terminal output_b, the second output circuit 22 is configured to write the second clock signal provided by the second clock signal terminal clkb to the second signal output terminal output_b under the control of the voltage of the first node pu; the second control circuit 23 is respectively connected with a second power supply terminal vdd2, the first node pu, a second reset signal terminal rst_b, the third power supply terminal vss, and the second signal output terminal output_b, the second control circuit 23 is configured to control a voltage of the second signal output terminal output_b and the voltage of the first node PU under the control of a second control voltage provided by the second power supply terminal vdd2 and a second reset voltage provided by the second reset signal terminal rst_b.

For example, in the time of the first frame, the first control signal is a pulse signal and the second control signal is a DC signal; in the time of the second frame, the first control signal is a DC signal and the second control signal is a pulse signal. In a case where the first control signal is a pulse signal, the phase, period, and the like of the first control signal are the same as those of the first input signal, so that, for example, the first control signal can be the first input signal. In a case where the second control signal is a pulse signal, the phase, period, and the like of the second control signal are the same as those of the second input signal, so that the second control signal can be the second input signal. It should be noted that the present disclosure is not limited thereto, in the time of the first frame, the first control signal may be a high-level DC signal and the second control signal may be a low-level DC signal; in the time of the first frame, the first control signal may be a low-level DC signal and the second control signal may be a high-level DC signal. In the embodiments of the present disclosure, for the first control signal, as long as the first control signal can be written to the first node pu to charge the first node pu in a case where the first input signal controls the first input circuit 11 to be turned on, that is, in a case where the first input signal controls the first input circuit 11 to be turned on, the first node pu can be pulled up by the first control signal. In addition, for the second control signal, as long as the second control signal can be written to the first node pu to charge the first node pu in a case where the second input signal controls the second input circuit 21 to be turned on, that is, in a case where the second input signal controls the second input circuit 21 to be turned on, the first node pu can be pulled up by the second control signal.

For example, in the time of the first frame, the first power supply terminal vdd1 outputs the first control voltage, and in the time of the second frame, the second power supply terminal vdd2 outputs the second control voltage. In the time of the first frame, the second power supply terminal vdd2 outputs a low-level voltage signal; and in the time of the second frame, the first power supply terminal vdd1 outputs a low-level voltage signal.

It should be noted that the first control voltage and the second control voltage may both be at a high level, and the pulse signal may be a square wave signal with high and low levels. For example, the pulse signal may be a signal that changes from a low level to a high level at time t1 and then changes from a high level to a low level at time t2 after time t (i.e., the time interval t between time t1 and time t2).

It should also be noted that "high level" and "low level" in this article refer to two logic states represented by a potential height range at a certain position respectively. For example, a high level may specifically refer to a potential higher than a voltage of a common terminal, a low level may specifically refer to a potential lower than the voltage of the common terminal, and at the same time, the "high level"

potentials at different positions may be different, and the "low level" potentials at different positions may also be different. It can be understood that the specific potential height range can be set according to needs in specific application scenarios, and the present disclosure is not limited thereto.

For example, as for the level setting of the first power supply terminal vdd and the second power supply terminal vdd2, in one frame time, a level of the first control voltage output by the first power supply terminal vdd1 can be set to a high level while a level of the second control voltage output by the second power supply terminal vdd2 is set to a low level, in this case, the first node pu and the first signal output terminal output_a are discharged, and in the adjacent next frame time, the level of the first control voltage output by the first power supply terminal vdd1 is set to a low level and the level of the second control voltage output by the second power supply terminal vdd2 is set to a high level, in this case, the first node pu and the second signal output terminal output_b are discharged.

Figure 3C:
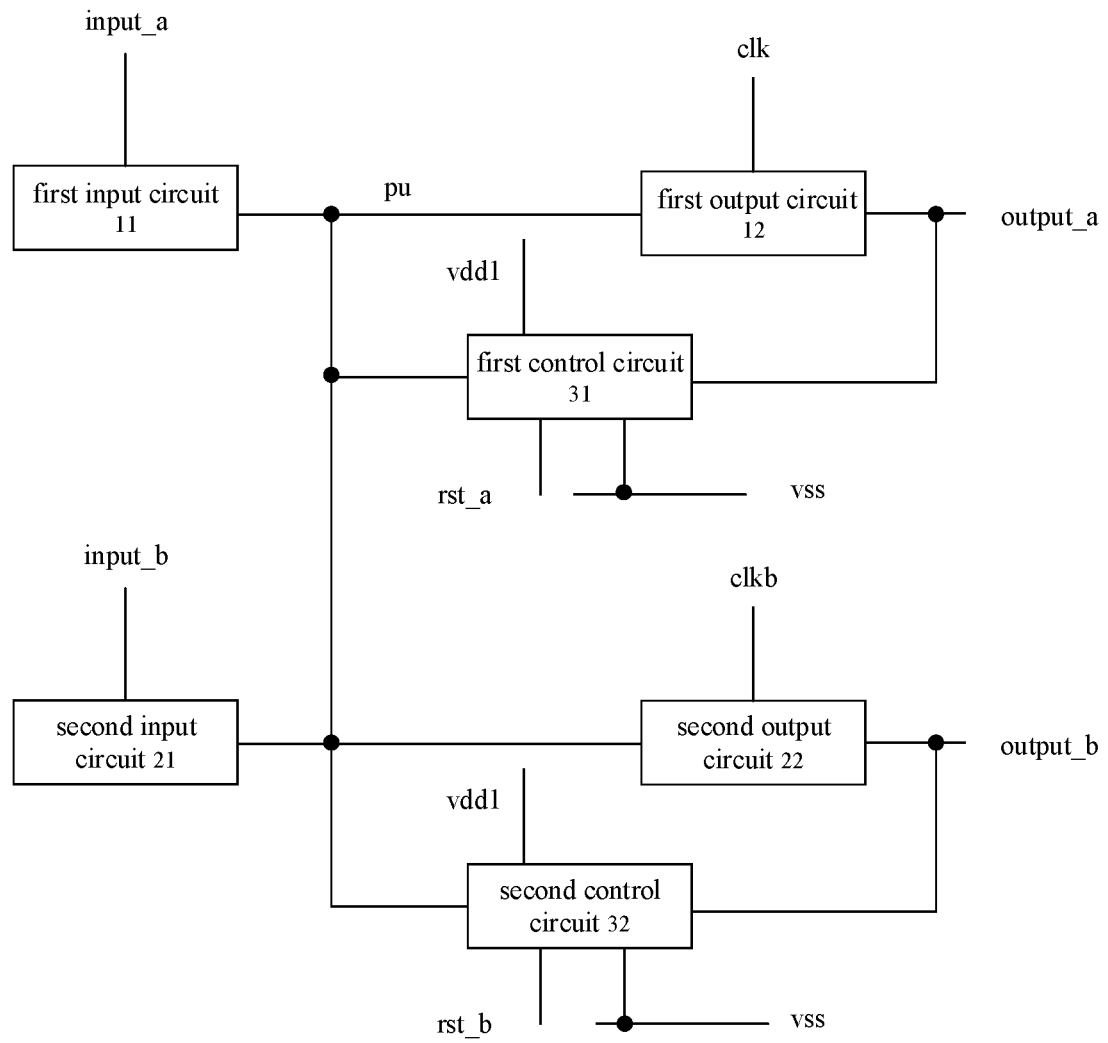
FIG. 3C is a block schematic diagram of yet another shift register according to some embodiments of the present disclosure.

FIG. 3C is a block schematic diagram of yet another shift register provided according to some embodiments of the present disclosure.

For example, as shown in FIG. 3C, in other embodiments, the first shift register unit 101 further includes a first input circuit 11, a first output circuit 12, and a first control circuit 31, the first input circuit 11 is respectively connected with the first signal input terminal input_a and a first node pu, and the first input circuit 11 is configured to write the first control signal to the first node pu under the control of the first input signal provided by the first signal input terminal input_a; the first output circuit 12 is respectively connected with the first node pu, the first clock signal terminal clk, and the first signal output terminal output_a, the first output circuit 12 is configured to write a first clock signal provided by the first clock signal terminal clk to the first signal output terminal output_a under the control of the voltage of the first node pu; the first control circuit 31 is respectively connected with the first power supply terminal vdd1, the first node pu, a first reset signal terminal rst_a, a third power supply terminal vss, and the first signal output terminal output_a, the first control circuit 31 is configured to control a voltage of the first signal output terminal output_a and the voltage of the first node pu under the control of a first control voltage provided by the first power supply terminal vdd1 and a first reset voltage provided by the first reset signal terminal rst_a.

For example, the second shift register unit 102 includes a second input circuit 21, a second output circuit 22, and a second control circuit 32. The second input circuit 21 is respectively connected with the second signal input terminal input_b and the first node pu, and the second input circuit 21 is configured to write the second control signal to the first node pu under the control of the second input signal provided by the second signal input terminal input_b; the second output circuit 22 is respectively connected with the first node pu, the second clock signal terminal clkb, and the second signal output terminal output_b, the second output circuit 22 is configured to write the second clock signal provided by the second clock signal terminal clkb to the second signal output terminal output_b under the control of the voltage of the first node pu; the second control circuit 32 is respectively connected with the first power supply terminal vdd1, the first node pu, a second reset signal terminal rst_b, the third power supply terminal vss, and the second signal output terminal output_b, the second control circuit 32 is used to control a voltage of the second signal output terminal output_b and the voltage of the first node pu under the control of a first control voltage provided by the first power supply terminal vdd1 and a second reset voltage provided by the second reset signal terminal rst_b.

For example, in both the time of the first frame and the time of the second frame, the first power supply terminal vdd1 outputs the first control voltage, and the first control voltage may be at a high level.

In addition, as for the level setting of the first clock signal terminal clk and the second clock signal terminal clkb, in one frame time, the first clock signal output by the first clock signal terminal clk can be set to a square wave signal with high and low pulses, while the second clock signal output by the second clock signal terminal clkb is set to a low level DC signal, and in the adjacent next frame time, the second clock signal output by the second clock signal terminal clkb is set to a square wave signal with high and low pulses, while the first clock signal output by the first clock signal terminal clk is set to a low level DC signal.

Therefore, when driving the pixel, the signal of the first signal output terminal output_a and the signal of the second signal output terminal output_b can respectively correspond to a first scan signal Vscan_a and s second scan signal Vscan_b provided in FIG. 1, that is, the signal of the first signal output terminal output_a corresponds to the first scan signal Vscan_a in FIG. 1, and the signal of the second signal output terminal output_b corresponds to the second scan signal Vscan_b in FIG. 1. In one frame time (for example, the time of the first frame), the first output circuit 12 writes the voltage of the first clock signal terminal clk to the first signal output terminal output_a, in a case where the first clock signal output by the first clock signal terminal clk is at a high level, the signal output by the first signal output terminal output_a is at a high level, so that the first sub-pixel circuit (i.e., the first data writing transistor T1, the first drive transistor T2, and the first capacitor C1) in FIG. 1 can be driven to operate, however, the second output circuit 22 writes the voltage of the second clock signal terminal clkb to the second signal output terminal output_b, because the second clock signal output by the second clock signal terminal clkb is at a low level, the second signal output terminal output_b always outputs a low level signal, so that pixel driving cannot be performed, for example, the second sub-pixel circuit (i.e., the second data writing transistor T1', the second drive transistor T2', and the second capacitor C1') in FIG. 1 cannot be driven to operate, that is, the second sub-pixel circuit does not operate, in summary, the driving timing of the N-th frame in FIG. 2 can be achieved to drive the pixel circuit shown in FIG. 1.

In the adjacent next frame time (for example, the time of the second frame), the second output circuit 22 writes the voltage of the second clock signal terminal clkb to the second signal output terminal output_b, in a case where the second clock signal output by the second clock signal terminal clkb is at a high level, the signal output by the second signal output terminal output_b is at a high level, so that, for example, the second sub-pixel circuit (i.e., the second data writing transistor T1', the second drive transistor T2', and the second capacitor C1') in FIG. 1 can be driven to operate, however, the first output circuit 12 writes the voltage of the first clock signal terminal clk to the first signal output terminal output_a, because the first clock signal output by the first clock signal terminal clk is at a low level, the first signal output terminal output_a always outputs a low level signal, therefore, pixel driving cannot be performed, for example, the first sub-pixel circuit (i.e., the first data writing transistor T1, the first drive transistor T2, and the first capacitor C1) in FIG. 1 cannot be driven to operate, i.e., the first sub-pixel circuit does not operate, in summary, the driving timing of the (N+1)-th frame in FIG. 2 can be achieved to drive the pixel circuit shown in FIG. 1.

As a result, the first shift register unit 101 and the second shift register unit 102 can alternately drive pixels to achieve the driving timing required by the pixel circuit using two sets of driving designs, and are easy to implement.

Figure 4A:
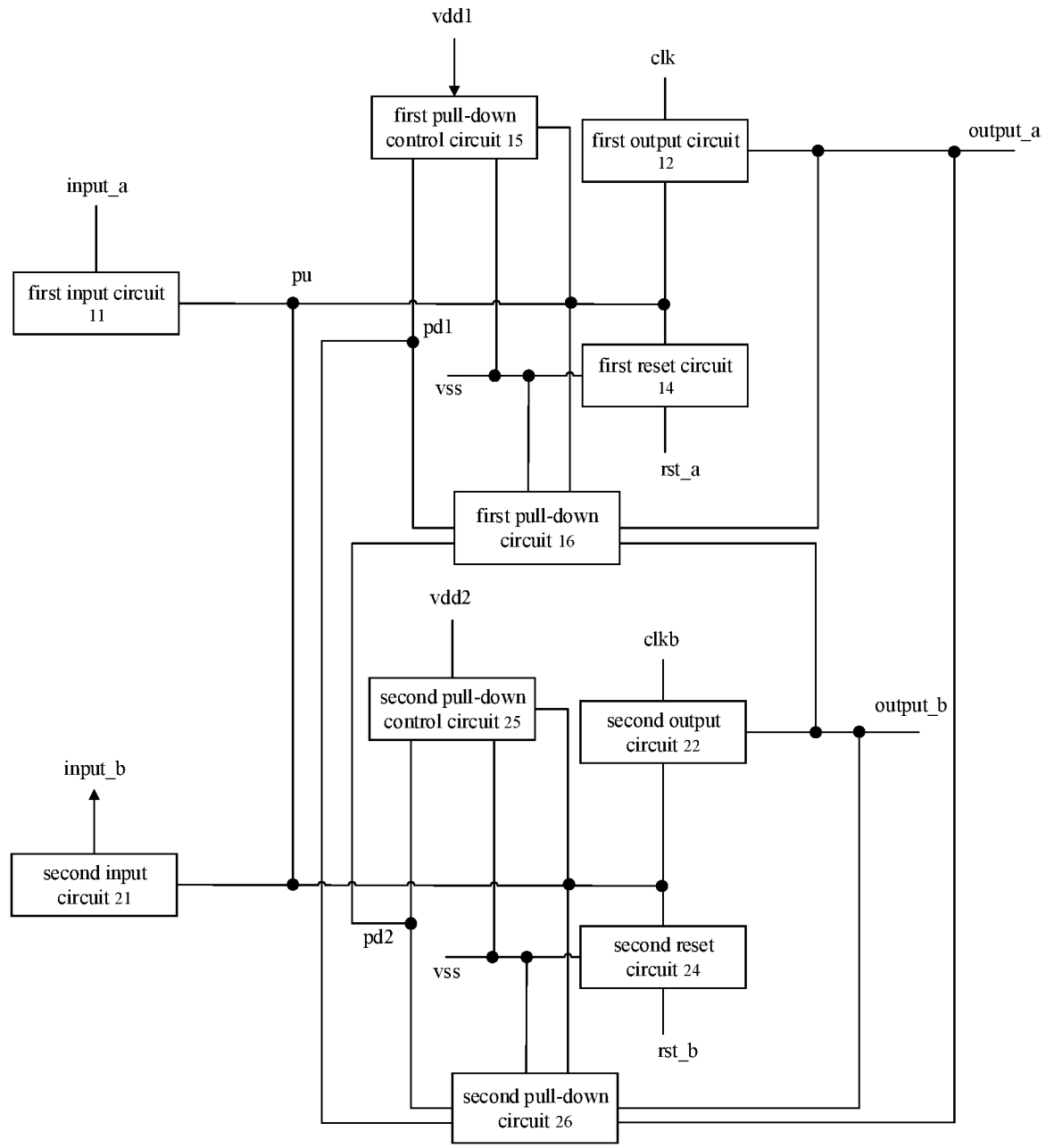
FIG. 4A is a block schematic diagram of a shift register according to other embodiments of the present disclosure.

FIG. 4A is a block schematic diagram of a shift register provided according to other embodiments of the present disclosure, the shift register shown in FIG. 4A is an example of the shift register shown in FIG. 3B.

FIG. 4A is a block schematic diagram of a shift register provided according to other embodiments of the present disclosure, and the shift register shown in FIG. 4A is an example of the shift register shown in FIG. 3B.

For example, as shown in FIG. 4A, in some embodiments, the first control circuit 13 includes a first reset circuit 14, a first pull-down control circuit 15, and a first pull-down circuit 16.

For example, the first reset circuit 14 is used to reset the first node pu under the control of the first reset signal terminal rst_a. As shown in FIG. 4A, the first reset circuit 14 is respectively connected with the first reset signal terminal rst_a, the third power supply terminal vss, and the first node pu, and the first reset circuit 14 is used to write the voltage of the third power supply terminal vss to the first node pu under the control of the first reset voltage provided by the first reset signal terminal rst_a.

The first pull-down control circuit 15 is connected with the first node pu and the second node pd1, respectively, and is configured to control a level of the second node pd1 under the control of the voltage of the first node pu. As shown in FIG. 4A, the first pull-down control circuit 15 is also connected with the first power supply terminal vdd1 and the third power supply terminal vss, respectively, the first pull-down control circuit 15 is used to write the first control voltage to the second node pd1 under the control of the first control voltage provided by the first power supply terminal vdd1, and write the voltage of the third power supply terminal vss to the second node pd1 under the control of the voltage of the first node pu.

As shown in FIG. 4A, the first pull-down circuit 16 is respectively connected with the second node pd1, the first node pu, the third power supply terminal vss, and the first signal output terminal output_a, the first pull-down circuit 16 is used to perform discharge process on the first node pu and the first signal output terminal output_a under the control of a voltage of the second node pd1.

For example, as shown in FIG. 4A, in some embodiments, the second control circuit 23 includes a second reset circuit 24, a second pull-down control circuit 25, and a second pull-down circuit 26.

For example, the second reset circuit 24 is used to reset the first node pu under the control of the second reset signal terminal rst_b. As shown in FIG. 4A, the second reset circuit 24 is respectively connected with the second reset signal terminal rst_b, the third power supply terminal vss, and the first node pu, and the second reset circuit 24 is used to write the voltage of the third power supply terminal vss to the first node pu under the control of the second reset voltage provided by the second reset signal terminal rst_b.

The second pull-down control circuit 25 is connected with the first node pu and the third node pd2, respectively, and is configured to control a level of the third node pd2 under the control of the voltage of the first node pu. As shown in FIG. 4A, the second pull-down control circuit 25 is also connected with the second power supply terminal vdd2 and the third power supply terminal vss, respectively, the second pull-down control circuit 25 is used to write the second control voltage to the third node pd2 under the control of the second control voltage provided by the second power supply terminal vdd2, and write the voltage of the third power supply terminal vss to the third node pd2 under the control of the voltage of the first node pu.

As shown in FIG. 4A, the second pull-down circuit 26 is connected with the third node pd2, the first node pu, the third power supply terminal vss, and the second signal output terminal output_b, respectively, the second pull-down circuit 26 is used to discharge the first node pu and the second signal output terminal output_b under the control of the voltage of the third node pd2.

For example, as shown in FIG. 4A, the first pull-down circuit 16 is further connected with the third node pd2 and the second signal output terminal output_b, and the first pull-down circuit 16 is further configured to discharge the third node pd2 and the second signal output terminal output_b under the control of the voltage of the second node pd1. The second pull-down circuit 26 is also connected with the second node pd1 and the first signal output terminal output_a, the second pull-down circuit 26 is also used to discharge the second node pd1 and the first signal output terminal OUTPUT_A under the control of the voltage of the third node pd2.

That is, in one frame time (for example, the time of the first frame), the level of the first control voltage output by the first power supply terminal vdd1 is set to a high level while the level of the second control voltage output by the second power supply terminal vdd2 is set to a low level. In this case, the first node pu and the first signal output terminal output_a can be discharged while the second signal output terminal output_b can also be discharged. In the adjacent next frame time (e.g., the time of the second frame), the level of the first control voltage output by the first power supply terminal vdd1 is set to a low level while the level of the second control voltage output by the second power supply terminal vdd2 is set to a high level, in this case, the first node pu and the second signal output terminal output_b can be discharged while the first signal output terminal output_a is also discharged.

Figure 4B:
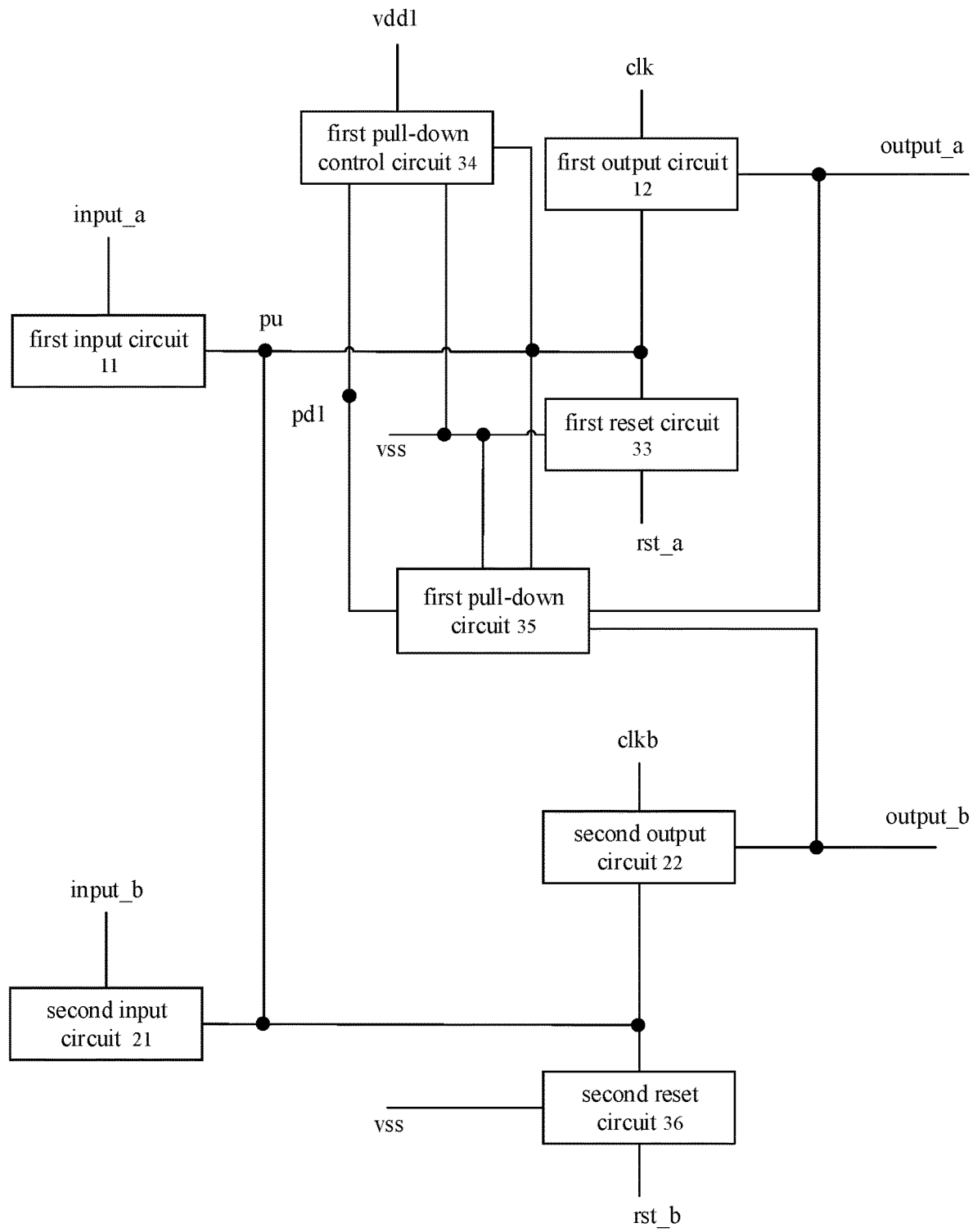
FIG. 4B is a block schematic diagram of yet another shift register according to other embodiments of the present disclosure.

FIG. 4B is a block schematic diagram of yet another shift register provided according to other embodiments of the present disclosure, and the shift register shown in FIG. 4B is an example of the shift register shown in FIG. 3C.

For example, as shown in FIG. 4B, the first control circuit 31 includes a first pull-down control circuit 34, a first pull-down circuit 35, and a first reset circuit 33.

For example, the first pull-down control circuit 34 is connected with the first node pu and the second node pd1, respectively, and is configured to control the level of the second node pd1 under the control of the voltage of the first node pu. As shown in FIG. 4B, the first pull-down control circuit 34 is also connected with the first power supply terminal vdd1 and the third power supply terminal vss, respectively, the first pull-down control circuit 34 is used to write the first control voltage to the second node pd1 under the control of the first control voltage provided by the first power supply terminal vdd1, and write the voltage of the third power supply terminal vss to the second node pd1 under the control of the voltage of the first node pu.

For example, as shown in FIG. 4B, the first pull-down circuit 35 is connected with the first node pu, the second node pd1, the third power supply terminal vss, and the first signal output terminal output_a, respectively, and is configured to discharge the first node pu and the first signal output terminal output_a under the control of the voltage of the second node pd1.

For example, as shown in FIG. 4B, the first reset circuit 33 is respectively connected with the first reset signal terminal rst_a, the third power supply terminal vss, and the first node pu, and the first reset circuit 33 is used to write the voltage of the third power supply terminal vss to the first node pu under the control of the first reset voltage provided by the first reset signal terminal rst_a.

For example, as shown in FIG. 4B, the second control circuit 32 includes the first pull-down control circuit 34, the first pull-down circuit 35, and a second reset circuit 36, that is, in this example, the first control circuit 31 and the second control circuit 32 can share the first pull-down control circuit 34 and the first pull-down circuit 35, thereby further saving the number of transistors and saving costs.

For example, as shown in FIG. 4B, the first pull-down circuit 34 is also connected with the second signal output terminal output_a, and is further configured to discharge the second signal output terminal output_a under the control of the voltage of the second node pd1.

For example, the second reset circuit 36 is respectively connected with the second reset signal terminal rst_b, the third power supply terminal vss, and the first node pu, and the second reset circuit 36 is used to write the voltage of the third power supply terminal vss to the first node pu under the control of the second reset voltage provided by the second reset signal terminal rst_b.

For example, in some examples, "first node" is a pull-up node, "second node" and "third node" are both pull-down nodes. It should be noted that, in the embodiments of the present disclosure, for example, in a case where each circuit is implemented as N-type transistors, the term "pull-up" means charging a node or an electrode of a transistor so as to raise the absolute value of the level of the node or the electrode, thereby implementing an operation (e.g., conduction) of the corresponding transistor; "Pull-down" means discharging a node or an electrode of a transistor so as to decrease the absolute value of the level of the node or the electrode, thereby implementing an operation (e.g., turn-off) of the corresponding transistor. For another example, in a case where each circuit is implemented as P-type transistors, the term "pull-up" means discharging a node or an electrode of a transistor so as to decrease the absolute value of the level of the node or the electrode, thereby implementing the operation (e.g., conduction) of the corresponding transistor; "Pull-down" means charging a node or an electrode of a transistor so as to raise the absolute value of the level of the node or the electrode, thereby implementing the operation (e.g., turn-off) of the corresponding transistor.

For example, the time of the first frame in any two adjacent frames includes a first input phase, a first output phase, and a first discharge phase, and the time of the second frame in any two adjacent frames includes a second input phase, a second output phase, and a second discharge phase.

The specific circuit structure and operation process of the shift register are described in detail below by taking the shift register shown in FIG. 4A as an example.

For example, in some embodiments, the operation process of the shift register 100 is as follows:

During the time of the first frame of any two adjacent frames, in the first input phase, the first signal input terminal input_a outputs the first input signal, and the first input circuit 11 writes the first input signal to the first node pu under the control of the first input signal.

In the first output phase, the first clock signal terminal clk outputs the first clock signal, and at this time, the first clock signal has a first level, the first output circuit 12 outputs the first clock signal to the first signal output terminal output_a under the control of the voltage of the first node pu. It should be noted that at this time, the voltage signal of the first node pu is larger than the first input signal.

In the first discharge phase, the first reset signal terminal rst_a outputs the first reset voltage, the first power supply terminal vdd1 outputs the first control voltage, the first reset circuit 14 of the first control circuit 13 outputs a voltage from the third power supply terminal vss to the first node pu under the control of the first reset voltage, the first pull-down control circuit 15 of the first control circuit 13 outputs the first control voltage to the second node pd1 under the control of the first control voltage, the first pull-down circuit 16 of the first control circuit 13 outputs the voltage from the third power supply terminal vss to the first node pu and the first signal output terminal output_a respectively under the control of the second node pd1.

During the time of the second frame of any two adjacent frames, in the second input phase, the second signal input terminal input_b outputs the second input signal, and the second input circuit 21 writes the second input signal to the first node pu under the control of the second input signal.

In the second output phase, the second clock signal terminal clkb outputs the second clock signal, and at this time the second clock signal has a first level, and the second output circuit 22 outputs the second clock signal to the second signal output terminal input_b under the control of the voltage of the first node pu. It should be noted that at this time, the voltage signal of the first node pu is larger than the second input signal.

In the second discharge phase, the second reset signal terminal rst_b outputs the second reset voltage, the second power supply terminal vdd2 outputs the second control voltage, the second reset circuit 24 of the second control circuit 23 outputs a voltage from the third power supply terminal vss to the first node pu under the control of the second reset voltage, the second pull-down control circuit 25 of the second control circuit 23 outputs the second control voltage to the third node pd2 under the control of the second control voltage, the second pull-down circuit 26 of the second control circuit 23 outputs the voltage from the third power supply terminal vss to the first node pu and the second signal output terminal output_b respectively under the control of the third node pd2.

In addition, the time of the first frame includes a first intermediate phase, and the first intermediate phase is between the first output phase and the first discharge phase. In the first intermediate phase, the first clock signal terminal clk outputs the first clock signal, and at this time the first clock signal has a second level, the first node pu maintains the first input signal, and the first output circuit 12 outputs the first clock signal having the second level to the first signal output terminal input_a under the control of the first node pu. The time of the second frame includes a second intermediate phase, and the second intermediate phase is between the second output phase and the second discharge phase. In the second intermediate phase, the second clock signal terminal clkb outputs the second clock signal, and at this time the second clock signal has a second level, the first node pu maintains the second input signal, and the second output circuit 22 outputs the second clock signal having the second level to the second signal output terminal input_b under the control of the first node pu.

In some specific examples of the present disclosure, the first level, the level of the first input signal, the level of the second input signal, the level of the first reset voltage, the level of the second reset voltage, the level of the first control voltage, and the level of the second control voltage all may be high levels, and the level of the voltage of the third power supply terminal vss and the second level may be low levels.

For example, assuming that during one frame time (for example, the N-th frame time), the level of the first control voltage is a high level, the level of the second control voltage is a low level, the first clock signal is a pulse signal, and the second clock signal is a low-level DC signal, therefore, the operation process of the shift register 100 during the N-th frame time may include:

In the first input phase, the first input signal output by the first signal input terminal input_a has a high level, the first input circuit 11 is turned on, the first input signal is written to the first node pu, the first output circuit 12 and the second output circuit 22 are turned on under the control of the first node pu, therefore, the first signal output terminal output_a outputs the first clock signal, and the second signal output terminal output_b outputs the second clock signal. Because both the first clock signal output by the first clock signal terminal clk and the second clock signal output by the second clock signal terminal clkb have low levels, that is, the first signal output terminal output_a and the second signal output terminal output_b output signals having low levels. At this time, the second input signal output by the second signal input terminal input_b has a low level, so the second input circuit 21 is turned off. Because the level of the first node pu is a high level, under the control of the first node pu, the first pull-down control circuit 15 writes the voltage of the third power supply terminal vss to the second node pd1, and the second pull-down control circuit 25 writes the voltage of the third power supply terminal vss to the third node pd2. The first reset voltage output by the first reset signal terminal rst_a and the second reset voltage output by the second reset signal terminal rst_b are, for example, low level voltages, and therefore, the first reset circuit 14 and the second reset circuit 24 are turned off. Thus, in the first input phase, the first node pu is charged to a high level (e.g., the first input signal), and the first signal output terminal output_a and the second signal output terminal output_b output signals having low levels.

In the first output phase, both the first input signal output by the first signal input terminal input_a and the second input signal output by the second signal input terminal input_b have, for example, low levels. At this time, the first input circuit 11 and the second input circuit 21 are turned off, but due to the capacitance holding effect of the first output circuit 12 and the second output circuit 22, the first output circuit 12 and the second output circuit 22 continue to be turned on. The first output circuit 12 outputs the first clock signal to the first signal output terminal output_a, that is, the first signal output terminal output_a outputs the first clock signal. Because the first clock signal output by the first clock signal terminal clk has a high level, the first signal output terminal output_a outputs a signal having a high level. Meanwhile, because the second output circuit 22 is turned on, the second output circuit 22 outputs the second clock signal to the second signal output terminal output_b, that is, the second signal output terminal output_b outputs the second clock signal, and the second clock signal output by the second clock signal terminal clkb has a low level, so the second signal output terminal output_b outputs a signal having a low level. Due to the capacitance bootstrap effect of the first output circuit 12 and the second output circuit 22, the voltage of the first node pu is further increased, that is, the voltage signal at the first node pu is larger than the first input signal at this time, and therefore, under the control of the first node pu, the first pull-down control circuit 15 writes the voltage of the third power supply terminal vss to the second node pd1, and the second pull-down control circuit 25 writes the voltage of the third power supply terminal vss to the third node pd2. Moreover, the first reset voltage output by the first reset signal terminal rst_a and the second reset voltage output by the second reset signal terminal rst_b are both low level voltages, and therefore, the first reset circuit 14 and the second reset circuit 24 are turned off.

In the first intermediate phase, both the first input signal output by the first signal input terminal input_a and the second input signal output by the second signal input terminal input_b have, for example, low levels. At this time, the first input circuit 11 and the second input circuit 21 are turned off, but due to the capacitance holding effect of the first output circuit 12 and the second output circuit 22, the first output circuit 12 and the second output circuit 22 continue to be turned on. Because both the first clock signal output by the first clock signal terminal clk and the second clock signal output by the second clock signal terminal clkb have low levels, and because the first signal output terminal output_a outputs the first clock signal, the second signal output terminal output_b outputs the second clock signal, that is, both the first signal output terminal output_a and the second signal output terminal output_b output signals having low levels. Because the first node pu is still at a high level (e.g., the first input signal), the second node pd1 and the third node pd2 remain at the voltage of the third power supply terminal vss. The first reset voltage output by the first reset signal terminal rst_a and the second reset voltage output by the second reset signal terminal rst_b are both low level voltages, and therefore, the first reset circuit 14 and the second reset circuit 24 are turned off.

In the first discharge phase, the first reset voltage output by the first reset signal terminal rst_a has a high level, the first reset circuit 14 is turned on, the first node pu is discharged to a low level, that is, the voltage of the first node pu is pulled down to the voltage of the third power supply terminal vss, and therefore the first output circuit 12 and the second output circuit 22 are turned off. Because the first control voltage has a high level, the first pull-down control circuit 15 writes the first control voltage to the second node pd1, that is, the second node pd1 is written with a high level voltage, and the first pull-down circuit 16 is turned on, so that the first node pu, the first signal output terminal output_a, and the second signal output terminal output_b are discharged to a low level, that is, the first node pu, the first signal output terminal output_a, and the second signal output terminal output_b are pulled down to the voltage of the third power supply terminal vss. Because the second control voltage has a low level, the potential of the third node pd2 is still at a low level, and the second pull-down circuit 26 is turned off. The second reset voltage output by the second reset signal terminal rst_b is a low level voltage, and the second reset circuit 24 is turned off.

For another example, in the adjacent next frame time (e.g., the (N+1)-th frame time), the level of the first control voltage is a low level, the level of the second control voltage is a high level, the first clock signal is a low level DC signal, and the second clock signal is a pulse signal. Thus, in the (N+1)-th frame time, the operation process of the shift register 100 may include:

In the second input phase, the second input signal output by the second signal input terminal input_b has a high level, the second input circuit 21 is turned on, the second input signal is written to the first node pu, the first output circuit 12 and the second output circuit 22 are turned on under the control of the first node pu, and therefore, the first signal output terminal output_a outputs the first clock signal, and the second signal output terminal output_b outputs the second clock signal. Because both the first clock signal output by the first clock signal terminal clk and the second clock signal output by the second clock signal terminal clkb have low levels, that is, the first signal output terminal output_a and the second signal output terminal output_b output signals having low levels. At this time, the first input signal output by the first signal input terminal input_a has a low level, so the first input circuit 11 is turned off. Because the level of the first node pu is a high level, under the control of the first node pu, the first pull-down control circuit 15 writes the voltage of the third power supply terminal vss to the second node pd1, and the second pull-down control circuit 25 writes the voltage of the third power supply terminal vss to the third node pd2. The first reset voltage output by the first reset signal terminal rst_a and the second reset voltage output by the second reset signal terminal rst_b are, for example, low level voltages, and therefore, the first reset circuit 14 and the second reset circuit 24 are turned off. Thus, in the second input phase, the first node pu is charged to a high level (e.g., a second input signal), and the first signal output terminal output_a and the second signal output terminal output_b output signals having low levels.

In the second output phase, both the first input signal output by the first signal input terminal input_a and the second input signal output by the second signal input terminal input_b have, for example, low levels. At this time, the first input circuit 11 and the second input circuit 21 are turned off, but due to the capacitance holding effect of the first output circuit 12 and the second output circuit 22, the first output circuit 12 and the second output circuit 22 continue to be turned on. The second output circuit 22 outputs the second clock signal to the second signal output terminal output_b, that is, the second signal output terminal output_b outputs the second clock signal. Because the second clock signal output by the second clock signal terminal clkb has a high level, and therefore, the second signal output terminal output_b outputs a signal having a high level. Meanwhile, because the first output circuit 12 is turned on, the first output circuit 12 outputs the first clock signal to the first signal output terminal output_a, that is, the first signal output terminal output_a outputs the first clock signal, and the first clock signal output by the first clock signal terminal clk has a low level, so the first signal output terminal output_a outputs a signal having a low level. Due to the capacitance bootstrap effect of the first output circuit 12 and the second output circuit 22, the voltage of the first node pu is further increased, that is, the voltage signal at the first node pu is larger than the first input signal at this time, whereby under the control of the first node pu, the first pull-down control circuit 15 writes the voltage of the third power supply terminal vss to the second node pd1, and the second pull-down control circuit 25 writes the voltage of the third power supply terminal vss to the third node pd2. The first reset voltage output by the first reset signal terminal rst_a and the second reset voltage output by the second reset signal terminal rst_b are both low level voltages, and therefore, the first reset circuit 14 and the second reset circuit 24 are turned off.

In the second intermediate phase, both the first input signal output by the first signal input terminal input_a and the second input signal output by the second signal input terminal input_b have low levels. At this time, the first input circuit 11 and the second input circuit 21 are turned off, but due to the capacitance holding effect of the first output circuit 12 and the second output circuit 22, the first output circuit 12 and the second output circuit 22 continue to be turned on. Because both the first clock signal output by the first clock signal terminal clk and the second clock signal output by the second clock signal terminal clkb have low levels, because the first signal output terminal output_a outputs the first clock signal, the second signal output terminal output_b outputs the second clock signal, that is, both the first signal output terminal output_a and the second signal output terminal output_b output signals having low levels. Because the first node pu is still at a high level (e.g., the second input signal), the second node pd1 and the third node pd2 remain at the voltage of the third power supply terminal vss. The first reset voltage output by the first reset signal terminal rst_a and the second reset voltage output by the second reset signal terminal rst_b are both low level voltages, and therefore, the first reset circuit 14 and the second reset circuit 24 are turned off.

In the second discharge phase, the first reset voltage output by the second reset signal terminal rst_b has a high level, the second reset circuit 24 is turned on, the first node pu is discharged to a low level, that is, the voltage of the first node pu is pulled down to the voltage of the third power supply terminal vss, so the first output circuit 12 and the second output circuit 22 are turned off. Because the second control voltage has a high level, the second pull-down control circuit 25 writes the second control voltage to the third node pd2, that is, the third node pd2 is written with a high level voltage, and the second pull-down circuit 26 is turned on, so that the first node pu, the first signal output terminal output_a, and the second signal output terminal output_b are discharged to a low level, that is, the first node pu, the first signal output terminal output_a, and the second signal output terminal output_b are pulled down to the voltage of the third power supply terminal vss. Because the first control voltage has a low level, the second node pd1 is still at a low level, and the first pull-down circuit 16 is turned off. The first reset voltage output by the first reset signal terminal rst_a is a low level voltage, and the first reset circuit 14 is turned off.

Therefore, in a case where the first control voltage and the second control voltage are alternately high level voltages in different frames, and the first clock signal and the second clock signal are alternately pulse signals in different frames at the same time, the first shift register unit 101 and the second shift register unit 102 can alternately drive pixels in different frames, thereby achieving the pixel driving timing in FIG. 2.

Figure 5A:
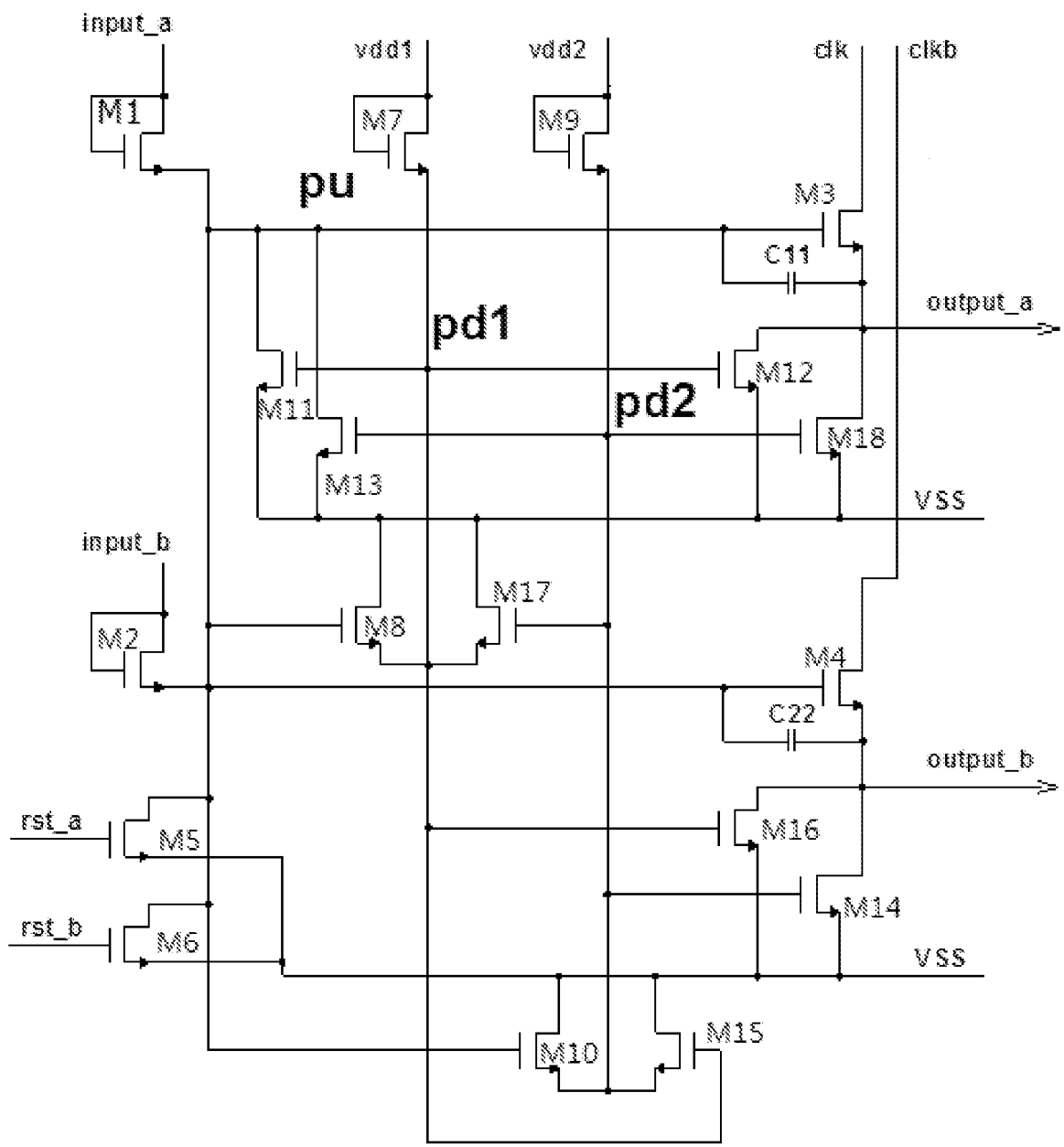
FIG. 5A is a circuit principle diagram of a shift register according to some embodiments of the present disclosure.

FIG. 5A is a circuit principle diagram of a shift register provided according to some embodiments of the present disclosure. The circuit structure of the shift register of some embodiments of the present disclosure are described in detail below with reference to FIG. 5A. FIG. 5A shows a circuit structure of the shift register shown in FIG. 4A.

For example, as shown in FIG. 5A, the first input circuit 11 includes a first transistor M1, a first electrode and a control electrode of the first transistor M1 are connected with a first signal input terminal input_a to receive a first input signal as a first control signal, and a second electrode of the first transistor M1 is connected with the first node pu; the second input circuit 21 includes a second transistor M2, a first electrode and a control electrode of the second transistor M2 are connected with a second signal input terminal input_b to receive a second input signal as a second control signal, and a second electrode of the second transistor M2 is connected with the first node pu.

For example, as shown in FIG. 5A, the first output circuit 12 includes a third transistor M3 and a first capacitor C11, a first electrode of the third transistor M3 is connected with the first clock signal terminal clk, a second electrode of the third transistor M3 is connected with the first signal output terminal output_a, a control electrode of the third transistor M3 is connected with the first node pu, a first end of the first capacitor C11 is connected with the first node pu, and a second end of the first capacitor C11 is connected with the first signal output terminal output_a; the second output circuit 22 includes a fourth transistor M4 and a second capacitor C22, a first electrode of the fourth transistor M4 is connected with the second clock signal terminal clkb, a second electrode of the fourth transistor M4 is connected with the second signal output terminal output_b, a control electrode of the fourth transistor M4 is connected with the first node pu, a first end of the second capacitor C22 is connected with the first node pu, and a second end of the second capacitor C22 is connected with the second signal output terminal output_b.

As shown in FIG. 5A, the first reset circuit 14 includes a fifth transistor M5, a first electrode of the fifth transistor M5 is connected with the first node pu, a second electrode of the fifth transistor M5 is connected with the third power supply terminal vss, and a control electrode of the fifth transistor M5 is connected with the first reset signal terminal rst_a; the second reset circuit 24 includes a sixth transistor M6, a first electrode of the sixth transistor M6 is connected with the first node pu, a second electrode of the sixth transistor M6 is connected with the third power supply terminal vss, and a control electrode of the sixth transistor M6 is connected with the second reset signal terminal rst_b.

As shown in FIG. 5A, the first pull-down control circuit 15 includes a seventh transistor M7 and an eighth transistor M8, a first electrode and a control electrode of the seventh transistor M7 are connected with the first power supply terminal vdd1, a second electrode of the seventh transistor M7 is connected with the second node pd1, a first electrode of the eighth transistor M8 is connected with the third power supply terminal vss, a second electrode of the eighth transistor M8 is connected with the second node pd1, and a control electrode of the eighth transistor M8 is connected with the first node pu. The second pull-down control circuit 25 includes a ninth transistor M9 and a tenth transistor M10, a first electrode and a control electrode of the ninth transistor M9 are connected with the second power supply terminal vdd2, a second electrode of the ninth transistor M9 is connected with the third node pd2, a first electrode of the tenth transistor M10 is connected with the third power supply terminal vss, a second electrode of the tenth transistor M10 is connected with the third node pd2, and a control electrode of the tenth transistor M10 is connected with the first node pu.

As shown in FIG. 5A, the first pull-down circuit 16 includes an eleventh transistor M11 and a twelfth transistor M12, a first electrode of the eleventh transistor M11 is connected with the first node pu, a second electrode of the eleventh transistor M11 is connected with the third power supply terminal vss, a control electrode of the eleventh transistor M11 is connected with the second node pd1, a first electrode of the twelfth transistor M12 is connected with the first signal output terminal output_a, a second electrode of the twelfth transistor M12 is connected with the third power supply terminal vss, and a control electrode of the twelfth transistor M12 is connected with the second node pd1. The second pull-down circuit 26 includes a thirteenth transistor M13 and a fourteenth transistor M14, a first electrode of the thirteenth transistor M13 is connected with the first node pu, a second electrode of the thirteenth transistor M13 is connected with the third power supply terminal vss, a control electrode of the thirteenth transistor M13 is connected with the third node pd2, a first electrode of the fourteenth transistor M14 is connected with the second signal output terminal output_b, a second electrode of the fourteenth transistor M14 is connected with the third power supply terminal vss, and a control electrode of the fourteenth transistor M14 is connected with the third node pd2.

As shown in FIG. 5A, the first pull-down circuit 16 further includes a fifteenth transistor M15 and a sixteenth transistor M16, a first electrode of the fifteenth transistor M15 is connected with the third node pd2, a second electrode of the fifteenth transistor M15 is connected with the third power supply terminal vss, a control electrode of the fifteenth transistor M15 is connected with the second node pd1, a first electrode of the sixteenth transistor M16 is connected with the second signal output terminal output_b, a second electrode of the sixteenth transistor M16 is connected with the third power supply terminal vss, and a control electrode of the sixteenth transistor M16 is connected with the second node pd1. The second pull-down circuit 26 further includes a seventeenth transistor M17 and an eighteenth transistor M18, a first electrode of the seventeenth transistor M17 is connected with the second node pd1, a second electrode of the seventeenth transistor M17 is connected with the third power supply terminal vss, a control electrode of the seventeenth transistor M17 is connected with the third node pd2, a first electrode of the eighteenth transistor M18 is connected with the first signal output terminal output_a, a second electrode of the eighteenth transistor M18 is connected with the third power supply terminal vss, and a control electrode of the eighteenth transistor M18 is connected with the third node pd2.

Figure 5B:
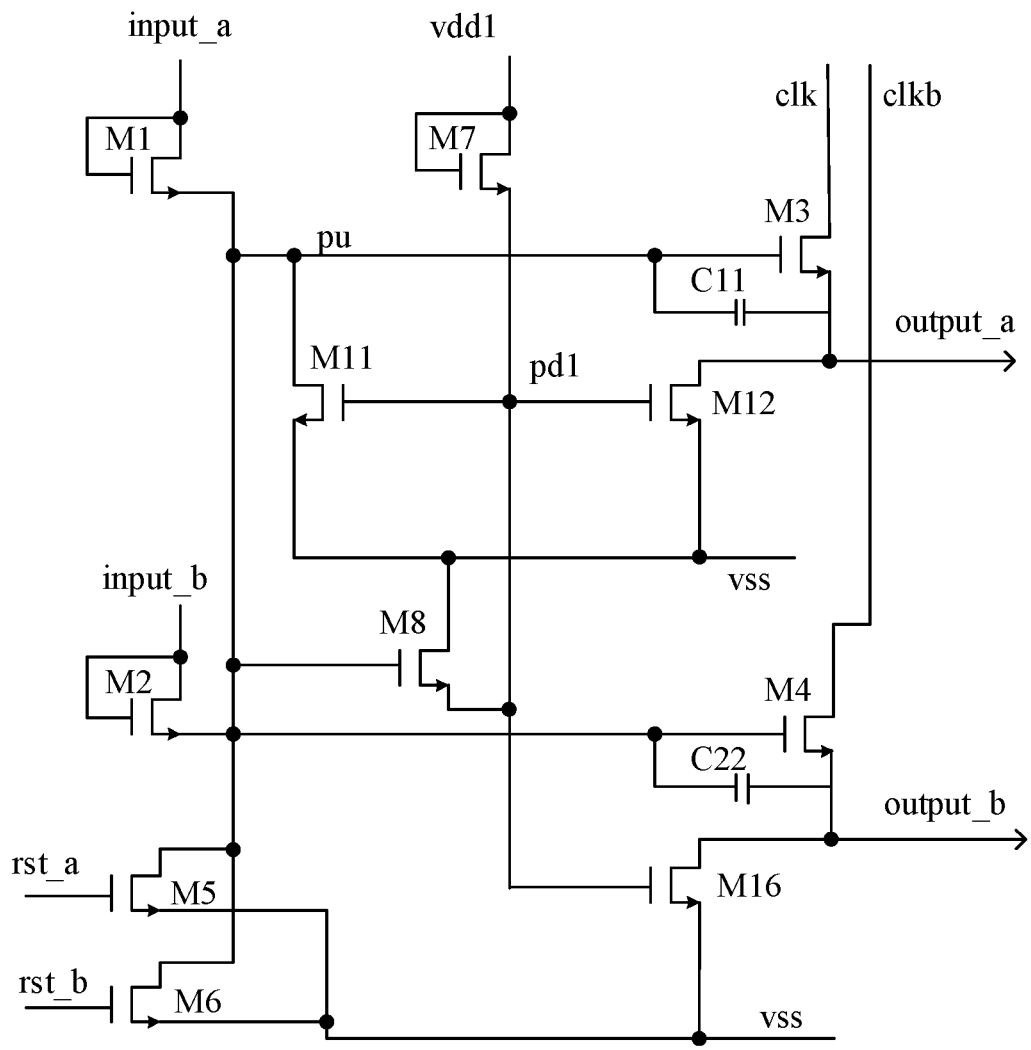
FIG. 5B is a circuit principle diagram of yet another shift register according to some embodiments of the present disclosure.

FIG. 5B is a circuit principle diagram of another shift register provided according to some embodiments of the present disclosure, and FIG. 5B shows a circuit structure of the shift register shown in FIG. 4B.

Compared with the shift register shown in FIG. 5A, the shift register shown in FIG. 4B may not include the ninth transistor M9, the tenth transistor M10, the thirteenth transistor M13, the fourteenth transistor M14, the fifteenth transistor M15, the seventeenth transistor M17, and the eighteenth transistor M18 shown in FIG. 5A. The shift register shown in FIG. 5B may include a first transistor M1 to an eighth transistor M8, an eleventh transistor M11, a twelfth transistor M12, a sixteenth transistor M16, a first capacitor C11, and a second capacitor C22, and the connection manner of the first transistor M1 to the eighth transistor M8, the eleventh transistor M11, the twelfth transistor M12, the sixteenth transistor M16, the first capacitor C11, and the second capacitor C22 is the same as that shown in FIG. 5A.

For example, as shown in FIG. 5B, the first input circuit 11 includes a first transistor M1, a first electrode and a control electrode of the first transistor M1 are connected with the first signal input terminal input_a to receive the first input signal as the first control signal, and a second electrode of the first transistor M1 is connected with the first node pu; the second input circuit 21 includes a second transistor M2, a first electrode and a control electrode of the second transistor M2 are connected with the second signal input terminal input_b to receive the second input signal as the second control signal, and a second electrode of the second transistor M2 is connected with the first node pu.

As shown in FIG. 5B, the first output circuit 12 includes a third transistor M3 and a first capacitor C11, a first electrode of the third transistor M3 is connected with the first clock signal terminal clk, a second electrode of the third transistor M3 is connected with the first signal output terminal output_a, a control electrode of the third transistor M3 is connected with the first node pu, a first end of the first capacitor C11 is connected with the first node pu, and a second end of the first capacitor C11 is connected with the first signal output terminal output_a; the second output circuit 22 includes a fourth transistor M4 and a second capacitor C22, a first electrode of the fourth transistor M4 is connected with the second clock signal terminal clkb, a second electrode of the fourth transistor M4 is connected with the second signal output terminal output_b, a control electrode of the fourth transistor M4 is connected with the first node pu, a first end of the second capacitor C22 is connected with the first node pu, and a second end of the second capacitor C22 is connected with the second signal output terminal output_b.

As shown in FIG. 5B, the first reset circuit 33 includes a fifth transistor M5, a first electrode of the fifth transistor M5 is connected with the first node pu, a second electrode of the fifth transistor M5 is connected with the third power supply terminal vss, and a control electrode of the fifth transistor M5 is connected with the first reset signal terminal rst_a; the second reset circuit 36 includes a sixth transistor M6, a first electrode of the sixth transistor M6 is connected with the first node pu, a second electrode of the sixth transistor M6 is connected with the third power supply terminal vss, and a control electrode of the sixth transistor M6 is connected with the second reset signal terminal rst_b.

As shown in FIG. 5B, the first pull-down control circuit 34 includes a seventh transistor M7 and an eighth transistor M8, a first electrode and a control electrode of the seventh transistor M7 are connected with the first power supply terminal vdd1, a second electrode of the seventh transistor M7 is connected with the second node pd1, a first electrode of the eighth transistor M8 is connected with the third power supply terminal vss, a second electrode of the eighth transistor M8 is connected with the second node pd1, and a control electrode of the eighth transistor M8 is connected with the first node pu.

As shown in FIG. 5B, the first pull-down circuit 35 includes an eleventh transistor M11, a twelfth transistor M12, and a sixteenth transistor M16, a first electrode of the eleventh transistor M11 is connected with the first node pu, a second electrode of the eleventh transistor M11 is connected with the third power supply terminal vss, and a control electrode of the eleventh transistor M11 is connected with the second node pd1. A first electrode of the twelfth transistor M12 is connected with the first signal output terminal output_a, a second electrode of the twelfth transistor M12 is connected with the third power supply terminal vss, a control electrode of the twelfth transistor M12 is connected with the second node pd1, a first electrode of the sixteenth transistor M16 is connected with the second signal output terminal output_b, a second electrode of the sixteenth transistor M16 is connected with the third power supply terminal vss, and a control electrode of the sixteenth transistor M16 is connected with the second node pd1.

As shown in FIG. 5B, the second reset circuit 36 includes a sixth transistor M6, a first electrode of the sixth transistor M6 is connected with the first node pu, a second electrode of the sixth transistor M6 is connected with the third power supply terminal vss, and a control electrode of the sixth transistor M6 is connected with the second reset signal terminal rst_b.

It should be noted that a control electrode of a transistor may refer to a gate electrode, a first electrode of the transistor may refer to a drain electrode, and a second electrode of the transistor may refer to a source electrode.

Figure 6:
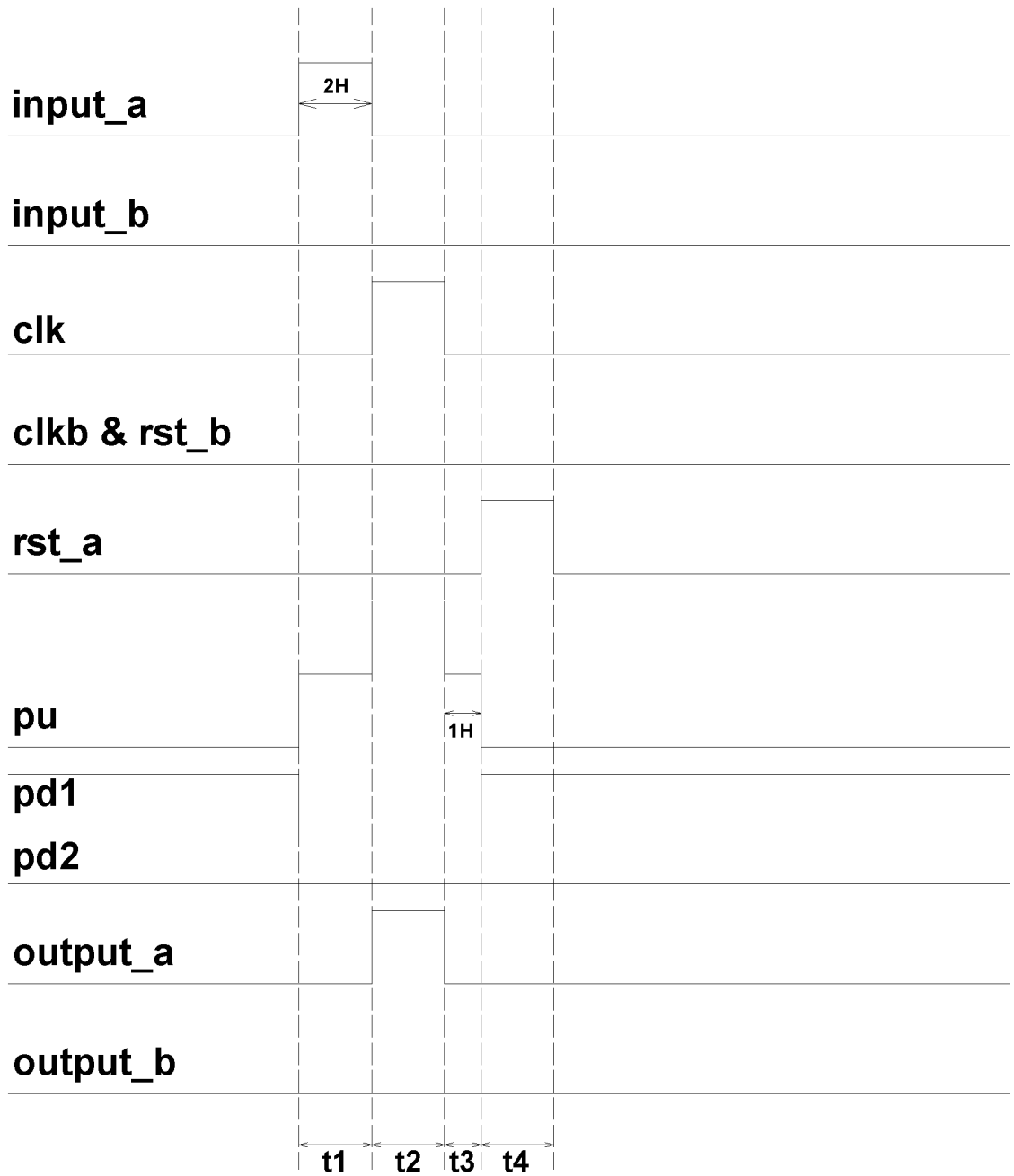
FIG. 6 is a schematic diagram of an operation timing of the shift register shown in FIG. 4A according to some embodiments of the present disclosure.

Assuming that, during one frame time, the first control voltage is a high level voltage, the second control voltage is a low level voltage, the first clock signal is a pulse signal, and the second clock signal is a low level DC signal, the operation process of the shift register shown in FIG. 5A are described in detail below with reference to the timing chart of FIG. 6. In FIG. 6 and the following description, vdd1, vdd2, input_a, input_b, clk, clkb, rst_a, rst_b, etc. are used to represent both corresponding signal terminals and corresponding signals. The following embodiments are the same as those described herein and will not be described again.

Because the first control voltage vdd1 is a high level voltage, the seventh transistor M7 is always turned on during one frame time, and the second control voltage vdd2 is a low level voltage, so the ninth transistor M9 is always turned off during one frame time.

For example, as shown in FIG. 5A and FIG. 6, a t1 time period corresponds to the first input phase, during the t1 time period, the first input signal input_a has a high level, the second input signal input_b, the first clock signal clk, the second clock signal clkb, the first reset voltage rst_a, and the second reset voltage rst_b all have low levels, because the first input signal input_a has a high level, the first transistor M1 is turned on. The first input signal input_a is written to the first node pu, the first capacitor C11, and the second capacitor C22. Therefore, the third transistor M3 and the fourth transistor M4 are turned on, so that the first signal output terminal output_a outputs the first clock signal clk and the second signal output terminal output_b outputs the second clock signal clkb. Because the first clock signal clk and the second clock signal clkb are both low level signals, the first signal output terminal output_a and the second signal output terminal output_b output low level signals. Because the second input signal input_b has a low level, the second transistor M2 is turned off. In addition, because the first node pu is at a high level, the eighth transistor M8 and the tenth transistor M10 are turned on, the second node pd1 is pulled to a low level voltage (i.e., the voltage of the third power supply terminal vss), and the third node pd2 is pulled to a low level voltage (i.e., the voltage of the third power supply terminal vss). Because the second node pd1 and the third node pd2 are pulled to the voltage of the third power supply terminal vss, both the eleventh transistor M11 to the eighteenth transistor M18 are turned off. In addition, because the first reset voltage rst_a and the second reset voltage rst_b are both low level voltages, the fifth transistor M5 and the sixth transistor M6 are turned off. Thus, in the first input phase, the first node pu can be charged to the first input signal, the third transistor M3 and the fourth transistor M4 are turned on, and the first signal output terminal output_a and the second signal output terminal output_b output signals having low levels.

It can be understood that, during the t1 time period, both the seventh transistor M7 and the eighth transistor M8 are turned on. Because the seventh transistor M7 charges the second node pd1 and the eighth transistor M8 discharges the second node pd1, in order to enable the second node pd1 to be pulled to the low level voltage, it can be achieved by appropriately setting the channel width ratio of the seventh transistor M7 and the eighth transistor M8. For example, the channel width ratio of the seventh transistor M7 and the eighth transistor M8 may be appropriately set such that W(M8)>>W(M7) (e.g., W(M7):W(M8)=1:5), that is, the channel width W(M8) of the eighth transistor M8 is much larger than the channel width W(M7) of the seventh transistor M7. In this way, the discharging speed of the second node pd1 when the eighth transistor M8 is turned on is much faster than the charging speed of the second node pd1 when the seventh transistor M7 is turned on, so the second node pd1 can be pulled to a low level voltage as long as the eighth transistor M8 is turned on, regardless of whether the seventh transistor M7 is turned on or not. Similarly, the channel width ratio of the ninth transistor M9 and the tenth transistor M10 can be similarly set such that W(M10)>>W(M9) (e.g., W(M9):W(M10)=1:5), that is, the channel width W(M10) of the tenth transistor M10 is much larger than the channel width W(M9) of the ninth transistor M9. Such that the discharging speed of the third node pd2 when the tenth transistor M10 is turned on is much faster than the charging speed of the third node pd2 when the ninth transistor M9 is turned on, so the third node pd2 is pulled to the low level voltage as long as the tenth transistor M10 is turned on, regardless of whether the ninth transistor M9 is turned on or not.

For example, as shown in FIG. 5A and FIG. 6, a t2 time period corresponds to the first output phase, during the t2 time period, the first clock signal clk has a high level, and the first input signal input_a, the second input signal input_b, the second clock signal clkb, the first reset voltage rst_a, and the second reset voltage rst_b all have low levels. In this case, because the first input signal input_a and the second input signal input_b are at a low level, the first transistor M1 and the second transistor M2 are turned off, however, due to the holding effects of the first capacitor C11 and the second capacitor C22, the third transistor M3 and the fourth transistor M4 continue to be turned on, because the first clock signal clk has a high level, the third transistor M3 outputs a high level signal to the first signal output terminal output_a, that is, the first signal output terminal output_a outputs a high level signal. Due to the bootstrap effect of the first capacitor C11, the potential of the first node pu is further pulled up, and at this time, the potential peak value of the first node pu is approximately 2 times the original value. Meanwhile, because the fourth transistor M4 is turned on and the second clock signal clkb still has a low level, the second signal output terminal output_b still outputs a low level signal. Because the discharging speed of the eighth transistor M8 is much faster than that of the seventh transistor M7, the potential of the second node pd1 is still at a low level. The tenth transistor M10 is turned on, and the second control voltage vdd2 has a low level, so the potential of the third node pd2 is still at a low level. Because the potentials of the second node pd1 and the third node pd2 are both at a low level, the eleventh transistor M11 to the eighteenth transistor M18 are all turned off. Because the first reset voltage rst_a and the second reset voltage rst_b are both low level voltages, and therefore, both the fifth transistor M5 and the sixth transistor M6 are turned off.

For example, as shown in FIG. 5A and FIG. 6, a t3 time period corresponds to the first intermediate phase (or a reset phase of the first signal output output_a). In the t3 time period, the first clock signal clk, the first input signal input_a, the second input signal input_b, the second clock signal clkb, the first reset voltage rst_a, and the second reset voltage rst_b all have low levels. At this time, the first input signal input_a and the second input signal input_b have low levels, so the first transistor M1 and the second transistor M2 are turned off. Due to the holding effects of the first capacitor C11 and the second capacitor C22, the third transistor M3 and the fourth transistor M4 continue to be turned on. Because both the first clock signal clk and the second clock signal clkb have low levels, at this time, due to the reverse discharge of the third transistor M3, the potential of the first signal output terminal output_a is discharged to a low level, and the fourth transistor M4 is turned on, the second clock signal clkb is still written to the second signal output terminal output_b, so that the second signal output terminal output_b is maintained at a low level. In this case, under the bootstrap effect of the first capacitor C11, the potential of the first node pu will drop to a level of the original high level, that is, the signal at the first node pu become approximately the first input signal. The potential of the first node pu is still at a high level, so that the potentials of the second node pd1 and the third node pd2 are still at a low level. Therefore, the eleventh transistor M11 to the eighteenth transistor M18 are all turned off. Because the first reset voltage rst_a and the second reset voltage rst_b are both low level voltages, and therefore, the fifth transistor M5 and the sixth transistor M6 are turned off.

For example, as shown in FIG. 5A and FIG. 6, a t4 time period corresponds to the first discharge phase. In the t4 time period, the first reset voltage rst_a has a high level, and the first clock signal clk, the first input signal input_a, the second input signal input_b, the second clock signal clkb, and the second reset voltage rst_b all have low levels. Because the first reset voltage rst_a has a high level, the fifth transistor M5 is turned on, so the first node pu is discharged to a low level, that is, the voltage of the first node pu is pulled down to the voltage of the third power supply terminal vss, so the third transistor M3 and the fourth transistor M4 are turned off, and the eighth transistor M8 and the tenth transistor M10 are turned off. The control electrode (i.e. a gate electrode) and the first electrode (i.e. a source electrode) of the seventh transistor M7 are both connected with the first power supply terminal vdd1, the first control voltage vdd1 output by the first power supply terminal vdd1 has a high level, and therefore, the seventh transistor M7 is turned on, and the second node pd1 is written to a high level, that is, the first control voltage vdd1, so the eleventh transistor M11, the twelfth transistor M12, the fifteenth transistor M15, and the sixteenth transistor M16 are turned on, so that the first node pu, the first signal output terminal output_a, and the second signal output terminal output_b are discharged to a low level. Because the second control voltage vdd2 has a low level, the potential of the third node pd2 is still at a low level, and therefore, the thirteenth transistor M13, the fourteenth transistor M14, the seventeenth transistor M17, and the eighteenth transistor M18 remain to be turned off. At this time, both the first input signal input_a and the second input signal input_b have low levels, so the first transistor M1 and the second transistor M2 are turned off. The second reset voltage rst_b is a low level voltage, so the sixth transistor M6 is turned off.

From the timing analysis of the above four time periods (i.e., the t1 time period to the t4 time period), it is known that the driving timing of FIG. 6 can achieve the driving timing of the N-th frame time in FIG. 2 in a case where the first control voltage vdd1 has a high level and the first clock signal clk is a pulse time signal; the same analysis shows that in a case where the second control voltage vdd2 has a high level and the second clock signal clkb is a pulse signal, the driving timing of the (N+1)-th frame time in FIG. 2 can be achieved. Thus, in a case where the first control voltage vdd1 and the second control voltage vdd2 are alternately at a high level in different frames and the first clock signal clk and the second clock signal clkb are alternately pulse signals in different frames, the pixel driving timing in FIG. 2 can be achieved.

According to the above embodiment, in different frames, the first clock signal is alternately a pulse signal and a low level DC signal, and correspondingly, the second clock signal is alternately a low level DC signal and a pulse signal, so that the first shift register unit and the second shift register unit can alternately drive pixels, and the requirement of the driving timing of FIG. 2 can be met. In addition, overall, the number of transistors used in the shift register is smaller, thereby making shift register easier to implement.

In summary, according to the shift register provided by some embodiments of the present disclosure, in time of one frame (e.g., the time of the first frame) of any two adjacent frames, the first power supply terminal outputs the first control voltage, and the first clock signal and the first input signal are pulse signals to make the first shift register unit operate, and in time of another frame (e.g., the time of the second frame) of any two adjacent frames, the second power supply terminal outputs the second control voltage, the second clock signal and the second input signal are pulse signals to make the second shift register unit operate, so that the first shift register unit and the second shift register unit alternately drive pixels, thereby achieving the driving timing required by a pixel circuit adopting two sets of driving designs and being easy to implement.

Figure 7:
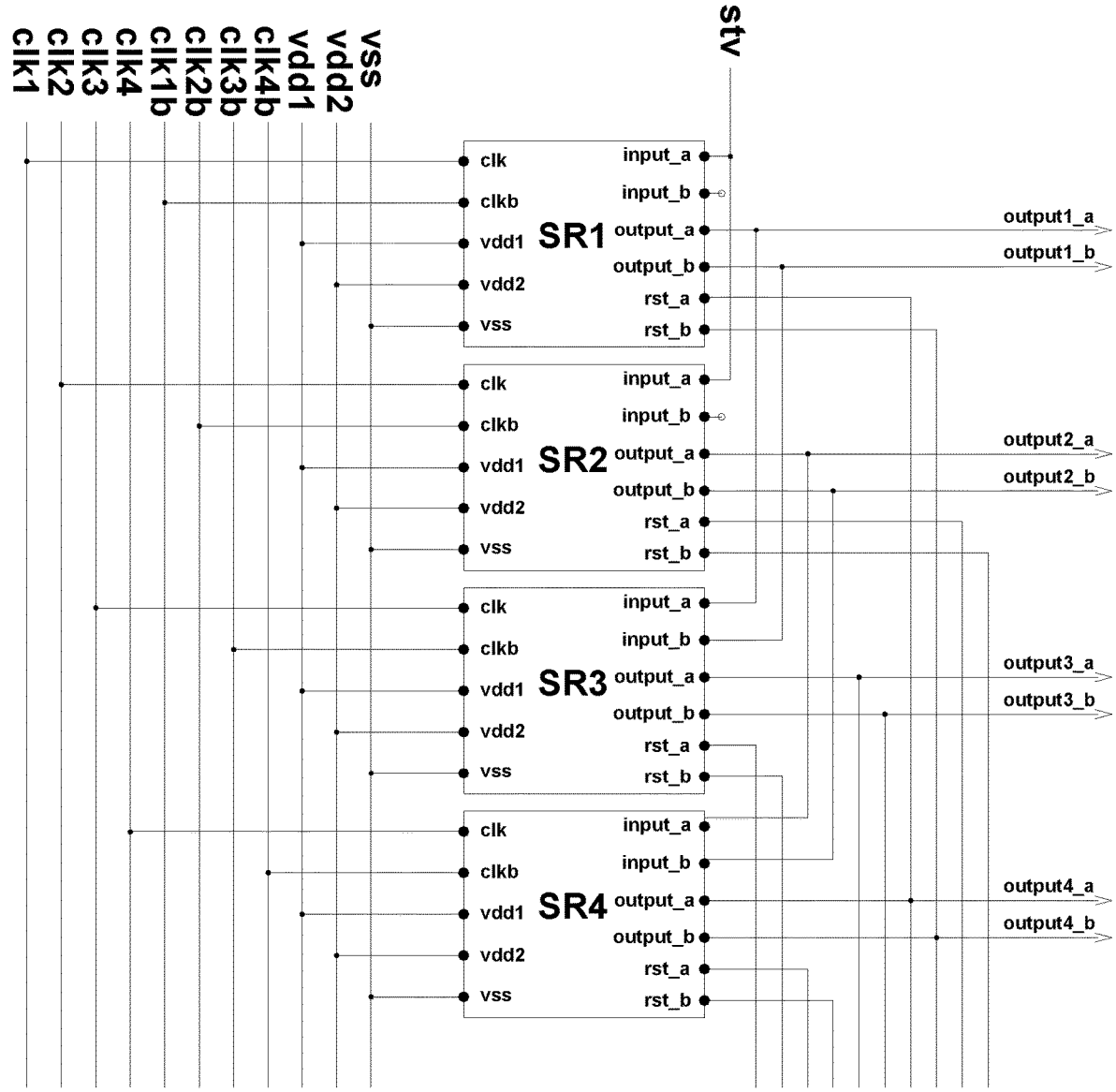
FIG. 7 is a structural schematic diagram of a gate drive circuit according to some embodiments of the present disclosure.
Figure 8:
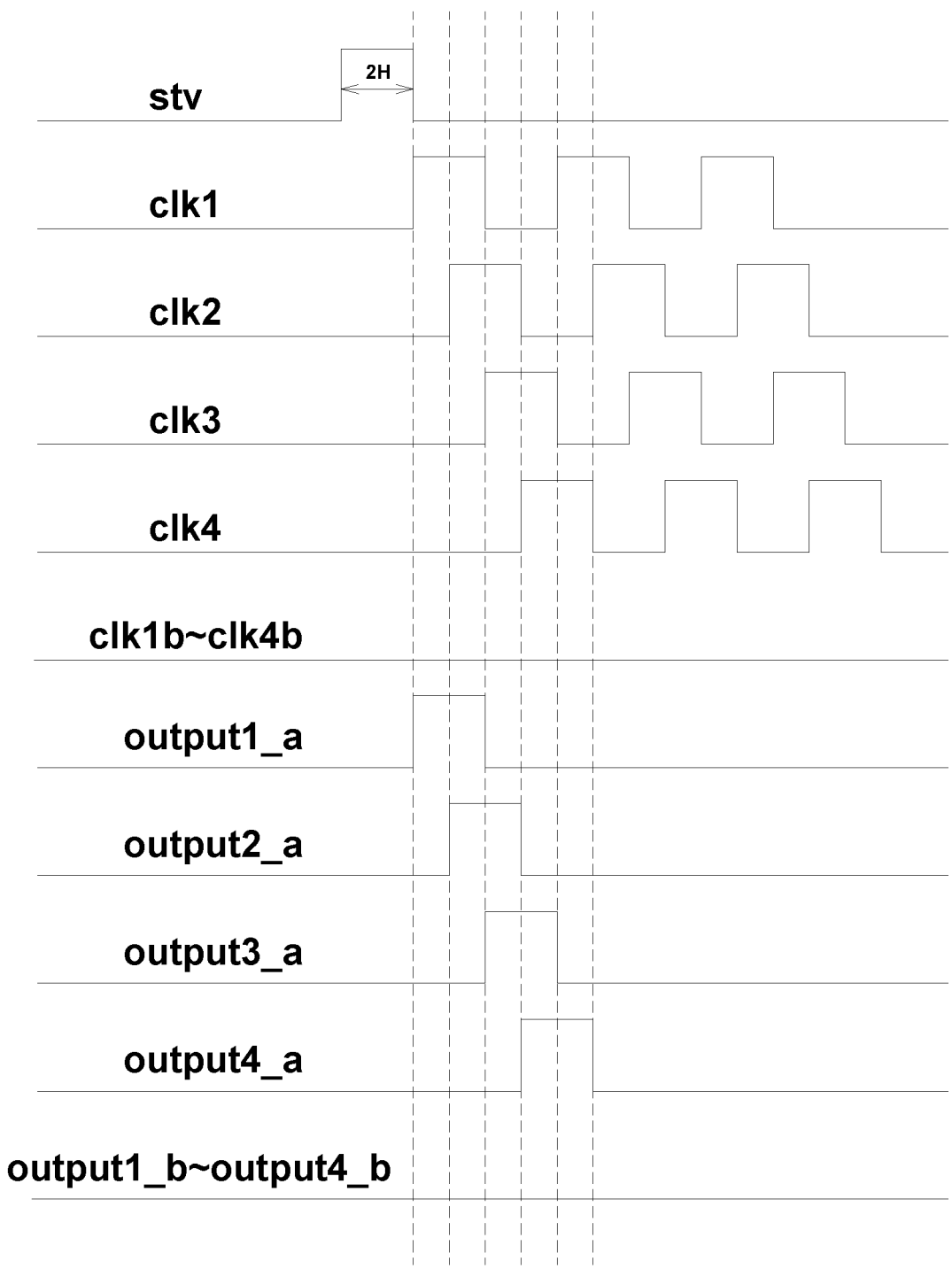
FIG. 8 is a schematic diagram of an operation timing of the gate drive circuit shown in FIG. 7 according to some embodiments of the present disclosure.

Some embodiments of the present disclosure further provide a gate drive circuit. FIG. 7 is a structural schematic diagram of a gate drive circuit provided according to some embodiments of the present disclosure, and FIG. 8 is a schematic diagram of an operation timing of the gate drive circuit shown in FIG. 7 provided according to some embodiments of the present disclosure.

For example, as shown in FIG. 7, the gate drive circuit includes a plurality of shift registers (e.g., SR1, SR2, SR3, and SR4 shown in FIG. 7), and the plurality of shift registers are connected in cascade. Each shift register is the shift register described in any one of the above embodiments. The gate drive circuit is described below by taking each shift register as the shift register shown in FIG. 4A as an example.

According to some embodiments of the present disclosure, a plurality of cascaded shift registers constitute a plurality of gate drive circuit groups, each gate drive circuit group comprises 2P shift registers, the 2P shift registers in each gate drive circuit group correspond to 2P clock signal groups, and two clock signals in each clock signal group are respectively provided to a first clock signal terminal clk and a second clock signal terminal clkb of a corresponding shift register, and p is a positive integer. That is, each shift register corresponds to one clock signal group, i.e., two clock signals in one clock signal group are transmitted to the first clock signal terminal clk and the second clock signal terminal clkb corresponding to the shift register shown in FIG. 3 to FIG. 6, that is, one clock signal group includes a first clock signal and a second clock signal. For example, P is a positive integer.

For example, in an N-th frame time, the first clock signal output by the first clock signal terminal clk is a pulse signal, and the second clock signal output by the second clock signal terminal clkb is a low level DC signal, each gate drive circuit group includes 2P first clock signal terminals clk, and 2P first clock signals output by the 2P first clock signal terminals clk are all pulse signals, assuming that a period of a pulse signal is T, then, in the 2P first clock signals, a phase of a (i+1)-th first clock signal is later than a phase of a i-th first clock signal by (T/2P) cycles. In an adjacent (N+1)-th frame time, the second clock signal output by the second clock signal terminal clkb is a pulse signal, the first clock signal output by the first clock signal terminal clk is a low level DC signal, each gate drive circuit group includes 2P second clock signal terminals clkb, and 2P second clock signals output by the 2P second clock signal terminals clkb are pulse signals, assuming that a period of a pulse signal is T, then, in the 2P second clock signals, a phase of a (i+1)-th second clock signal is later than a phase of a i-th second clock signal by (T/2P) cycles. i is a positive integer.

In a case of P=1, a first signal input terminal of each stage of the shift registers is connected with a first signal output terminal of a previous-stage shift register, a second signal input terminal of each stage of the shift registers is connected with a second signal output terminal of the previous-stage shift register, a first reset signal terminal of each stage of the shift registers is connected with a first signal output terminal of a next-stage shift register, and a second reset signal terminal of each stage of the shift registers is connected with a second signal output terminal of the next-stage shift register.

It should be noted that the previous-stage shift register refers to a previous-stage shift register of a current-stage shift register, and the next-stage shift register refers to a next-stage gate drive circuit of the current-stage shift register. Taking a j-th stage shift register as the current-stage shift register as an example, a previous-stage shift register of the j-th stage shift register is a (j−1)-th stage shift register, and a next-stage shift register of the j-th stage shift register is a (j+1)-th stage shift register. That is to say, a first signal input terminal of the j-th stage shift register is connected with a first signal output terminal of the (j−1)-th stage shift register, a second signal input terminal of the j-th stage shift register is connected with a second signal output terminal of the (j−1)-th stage shift register, a first reset signal terminal of the j-th stage shift register is connected with a first signal output terminal of the (j+1)-th stage shift register, and a second reset signal terminal of the j-th stage shift register is connected with a second signal output terminal of the (j+1)-th stage shift register.

In a case where P is greater than 1, a first signal input terminal of each stage of the shift registers is connected with a first signal output terminal of a former P-stage shift register, a second signal input terminal of each stage of the shift registers is connected with a second signal output terminal of the former P-stage shift register, a first reset signal terminal of each stage of the shift registers is connected with a first signal output terminal of a rear (P+1)-stage shift register, and a second reset signal terminal of each stage of the shift registers is connected with a second signal output terminal of the rear (P+1)-stage shift register.

It should be noted that the former P-stage shift register refers to a former P-stage shift register of the current-stage shift register, and the rear (P+1)-stage shift register refers to a rear (P+1)-stage shift register of the current-stage shift register. Taking the j-th stage shift register as the current-stage shift register as an example, a former P-stage shift register of the j-th stage shift register is a (j−P)-th stage shift register, and a rear (P+1)-stage shift register of the j-th stage shift register is a (j+P+1)-th stage shift register. That is to say, a first signal input terminal of the j-th stage shift register is connected with a first signal output terminal of the (j−P)-th stage shift register, a second signal input terminal of the j-th stage shift register is connected with a second signal output terminal of the (j−P)-th stage shift register, a first reset signal terminal of the j-th stage shift register is connected with a first signal output terminal of the (j+P+1)-th stage shift register, and a second reset signal terminal of the j-th stage shift register is connected with a second signal output terminal of the (j+P+1)-th stage shift register.

For example, j is an integer greater than P.

It can be understood that, as shown in FIG. 7, in a case where the current-stage shift register does not have a former P-stage shift register or a previous-stage shift register, a first signal input terminal and the second signal input terminal of the current-stage shift register can be connected with a preset control signal terminal STY. In case where the current-stage shift register does not have a rear (P+1)-stage shift register or a next-stage shift register, a first reset signal terminal and a second reset signal terminal of the current-stage shift register can be connected with a preset reset signal terminal.

Four clock signal groups are taken as an example to describe in detail in conjunction with FIG. 7 and FIG. 8, that is, P=2.

As shown in FIG. 7, the gate drive circuit includes a first-stage shift register SR1, a second-stage shift register SR2, a third-stage shift register SR3, and a fourth-stage shift register SR4, each stage of the shift registers has a first signal output terminal output_a and a second signal output terminal output_b, when driving pixels, signals output by the first signal output terminal output_a and the second signal output terminal output_b can respectively correspond to the first scan signal Vscan_a and the second scan signal Vscan_b in FIG. 2.

For example, as shown in FIG. 7, the gate drive circuit further includes a first clock signal line clk1, a second clock signal line clk2, a third clock signal line clk3, and a fourth clock signal line clk4. The connection mode between shift registers at all stages and the above-mentioned clock signal lines is as follows and so on. A first clock signal terminal clk of a (4n−3)-th stage shift register (e.g., the first-stage shift register SR1) is connected with the first clock signal line clk1, a first clock signal terminal clk of a (4n−2)-th stage shift register (e.g., the second-stage shift register SR2) is connected with the second clock signal line clk2, a first clock signal terminal clk of a (4n−1)-th stage shift register unit (e.g., the third-stage shift register SR3) is connected with the third clock signal line clk3, and a first clock signal terminal clk of a (4n)-th stage shift register unit (e.g., the fourth-stage shift register SR4) is connected with the fourth clock signal line clk4. Here, n is an integer greater than 0.

For example, as shown in FIG. 7, the gate drive circuit further includes a fifth clock signal line clkb1, a sixth clock signal line clkb2, a seventh clock signal line clkb3, and an eighth clock signal line clkb4. The connection mode between shift registers at all stages and the above-mentioned clock signal lines is as follows and so on. A second clock signal terminal clkb of the (4n−3)-th stage shift register (e.g., the first-stage shift register SR1) is connected with the fifth clock signal line clkb1, a second clock signal terminal clkb of the (4n−2)-th stage shift register (e.g., the second-stage shift register SR2) is connected with the sixth clock signal line clkb2, and a second clock signal terminal clkb of the (4n−1)-th stage shift register unit (e.g., the third-stage shift register SR3) is connected with the seventh clock signal line clkb3, and a second clock signal terminal clkb of the (4n)-th stage shift register unit (e.g., the fourth-stage shift register SR4) is connected with the eighth clock signal line clkb4.

For example, as shown in FIG. 7, the gate drive circuit further includes a first power supply line vdd1, a second power supply line vdd2, and a third power supply line vss. A first power supply terminal vdd1 of each stage of the shift registers is connected with the first power supply line vdd1, a second power supply terminal vdd2 of each stage of the shift registers is connected with the second power supply line vdd2, and a third power supply terminal vss of each stage of the shift registers is connected with the third power supply line vss.

Also, as shown in FIG. 7, the first signal output terminal output1_a and the second signal output terminal output1_b of the first-stage shift register SR1 are respectively connected with the first signal input terminal input3_a and the second signal input terminal input3_b of the third-stage shift register SR3, and the first signal output terminal output2_a and the second signal output terminal output2_b of the second-stage shift register SR2 are respectively connected with the first signal input terminal input4_a and the second signal input terminal input4_b of the fourth-stage shift register SR4. The first signal output terminal output4_a and the second signal output terminal output4_b of the fourth-stage shift register SR4 is connected with the first reset signal terminal rst_a and the second reset signal terminal rst_b of the first-stage shift register SR1, respectively.

As shown in FIG. 8, in a case where the signals output by the first clock signal line clk1, the second clock signal line clk2, the third clock signal line clk3, and the fourth clock signal line clk4 are all pulse signals, and the signals output by the fifth clock signal line clkb1, the sixth clock signal line clkb2, the seventh clock signal line clkb3, and the eighth clock signal line clkb4 are all low level DC signals, the first signal output terminal output1_a of the first-stage shift register to the first signal output terminal output4_a of the fourth-stage shift register sequentially output row drive signals, while the second signal output terminal output1_b of the first-stage shift register to the second signal output terminal output4_b of the fourth-stage shift register always output low level signals. Similarly, in a case where the signals output by the fifth clock signal line clkb1, the sixth clock signal line clkb2, the seventh clock signal line clkb3, and the eighth clock signal line clkb4 are all pulse signals, and the signals output by the first clock signal line clk1, the second clock signal line clk2, the third clock signal line clk3, and the fourth clock signal line clk4 are all low level DC signals, the second signal output terminal output1_b of the first-stage shift register to the second signal output terminal output4_b of the fourth-stage shift register sequentially output row drive signals, while the first signal output terminal output1_a of the first-stage shift register to the first signal output terminal output4_a of the fourth-stage shift register always output low level signals.

Therefore, through the cascade structure of the shift registers, the first clock signal of each stage of the shift registers is alternately a pulse signal and a low level DC signal in different frames, and correspondingly, the second clock signal of each stage of the shift registers is alternately a low level DC signal and a pulse signal, so that it can be achieved that the driving timing of the pixel driving is alternately performed by the first shift register unit and the second shift register unit of each stage of the shift registers, and overall, the number of transistors used is small, so that the gate drive circuit is simpler to implement.

In summary, according to the gate drive circuit provided by some embodiments of the present disclosure, the pixel driving is alternately performed by the first shift register units and the second shift register units of a plurality of shift registers, so that the driving timing required by the pixel circuit adopting two sets of driving designs is achieved, and the gate drive circuit is easy to implement.

Figure 9:
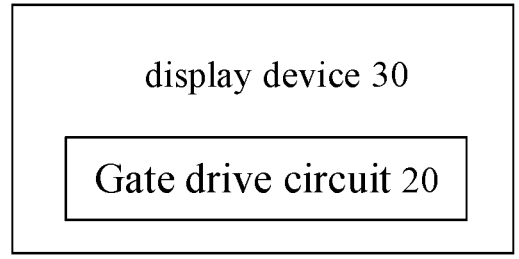
FIG. 9 is a block schematic diagram of a display device according to some embodiments of the present disclosure.

Some embodiments of the present disclosure also provide a display device. FIG. 9 is a block schematic diagram of a display device provided according to some embodiments of the present disclosure. For example, as shown in FIG. 9, the display device 30 includes a gate drive circuit 20, and the gate drive circuit 20 is the gate drive circuit described in any one of the above embodiments of the present disclosure.

For example, the display device 30 may be a liquid crystal display (LCD) panel, an LCD television, a display, an organic light-emitting diode (OLED) panel, an OLED television, an electronic paper display device, a mobile phone, a tablet computer, a notebook computer, a digital photo frame, a navigator and any other product or component having a display function, and the embodiments of the present disclosure are not limited thereto. The technical effects of the display device 30 can be referred to the corresponding descriptions of the shift register 100 and the gate drive circuit 20 in the above-mentioned embodiments, and are not repeated herein again.

Figure 10:
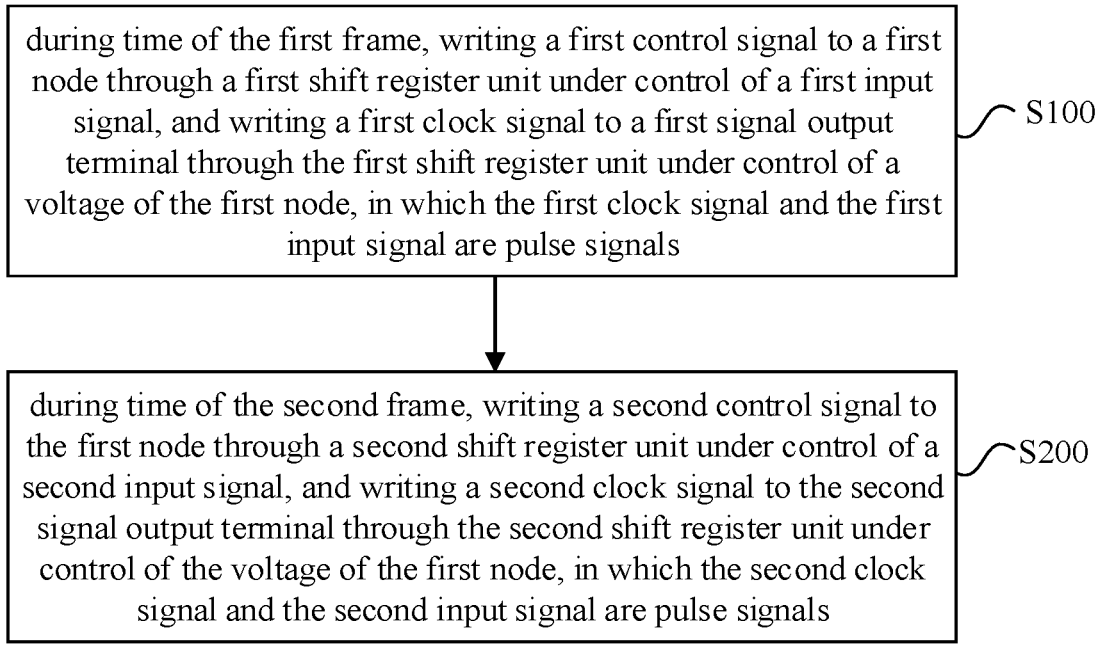
FIG. 10 is a flowchart of a control method of a shift register according to some embodiments of the present disclosure.
Figure 11:
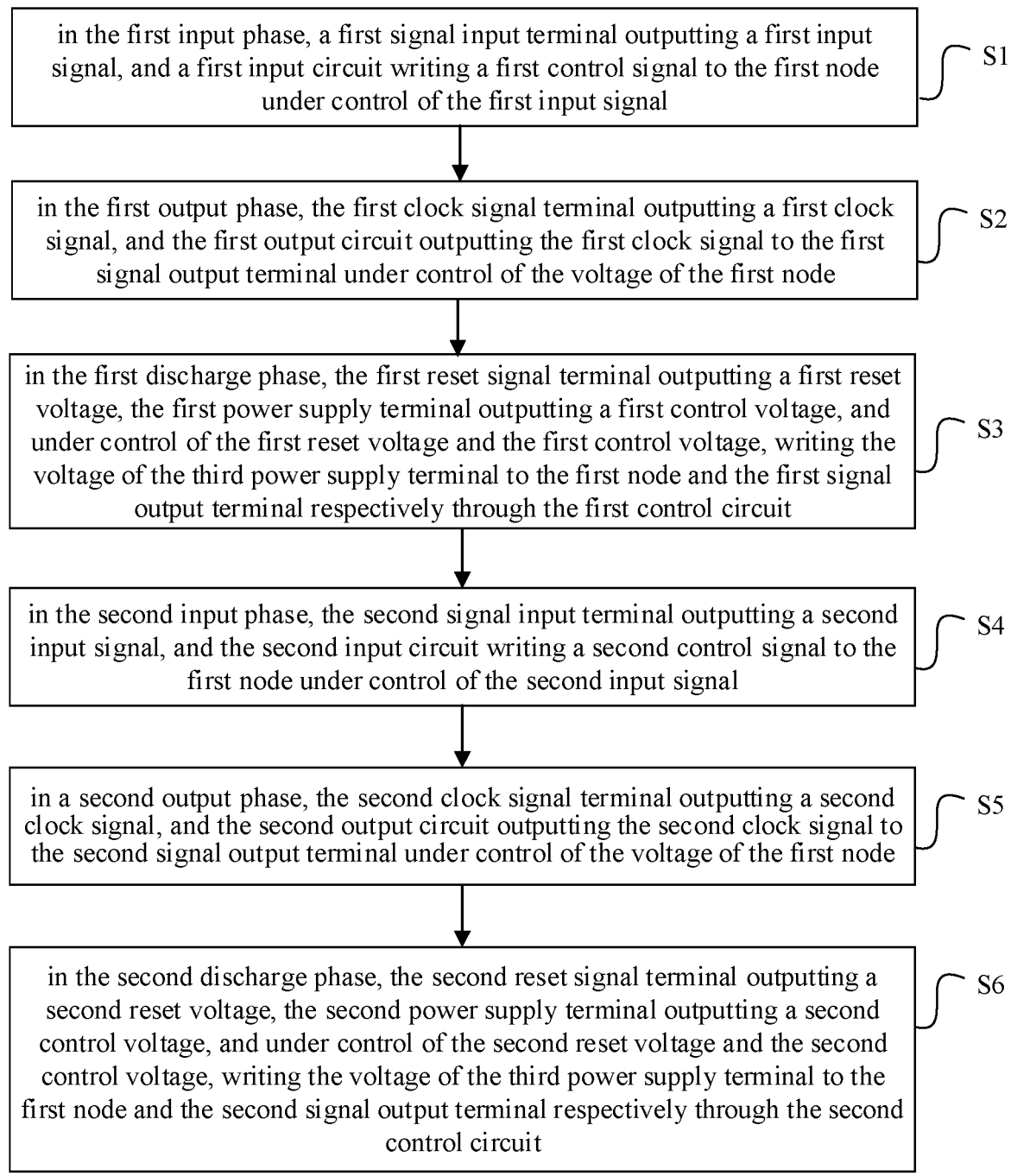
FIG. 11 is a flowchart of another control method of a shift register according to some embodiments of the present disclosure.

Some embodiments of the present disclosure also provide a control method of a shift register. FIG. 10 is a flowchart of a control method of a shift register provided according to some embodiments of the present disclosure, and FIG. 11 is a flowchart of a control method of another shift register provided according to some embodiments of the present disclosure.

For example, any two adjacent frames include a first frame and a second frame. As shown in FIG. 10, the control method of the shift register 100 includes the following operations:

S100: during time of the first frame, writing a first control signal to a first node through a first shift register unit under control of a first input signal, and writing a first clock signal to a first signal output terminal through the first shift register unit under control of a voltage of the first node, in which the first clock signal and the first input signal are pulse signals;

S200: during time of the second frame, writing a second control signal to the first node through a second shift register unit under control of a second input signal, and writing a second clock signal to the second signal output terminal through the second shift register unit under control of the voltage of the first node, in which the second clock signal and the second input signal are pulse signals.

For example, each shift register includes the first shift register unit and the second shift register unit. The first shift register unit includes a first input circuit, a first output circuit, and a first control circuit, and the second shift register unit includes a second input circuit, a second output circuit, and a second control circuit.

The control method of the shift register is described below by taking a case that each shift register is the shift register shown in FIG. 4A as an example.

For example, the time of the first frame includes a first input phase, a first output phase, and a first discharge phase, and the time of the second frame includes a second input phase, a second output phase, and a second discharge phase.

For example, as shown in FIG. 11, step S100 includes:

S1: in the first input phase, a first signal input terminal outputting a first input signal, and a first input circuit writing a first control signal to the first node under control of the first input signal;

S2: in the first output phase, the first clock signal terminal outputting a first clock signal, and the first output circuit outputting the first clock signal to the first signal output terminal under control of the voltage of the first node;

S3: in the first discharge phase, the first reset signal terminal outputting a first reset voltage, the first power supply terminal outputting a first control voltage, and under control of the first reset voltage and the first control voltage, writing the voltage of the third power supply terminal to the first node and the first signal output terminal respectively through the first control circuit.

For example, in step S3, the first reset voltage has a high level.

For example, as shown in FIG. 11, step S200 includes:

S4: in the second input phase, the second signal input terminal outputting a second input signal, and the second input circuit writing a second control signal to the first node under control of the second input signal;

S5: in a second output phase, the second clock signal terminal outputting a second clock signal, and the second output circuit outputting the second clock signal to the second signal output terminal under control of the voltage of the first node;

S6: in the second discharge phase, the second reset signal terminal outputting a second reset voltage, the second power supply terminal outputting a second control voltage, and under control of the second reset voltage and the second control voltage, writing the voltage of the third power supply terminal to the first node and the second signal output terminal respectively through the second control circuit.

For example, in step S6, the second reset voltage has a high level.

It should be noted that, for detailed descriptions of steps S1-S6, reference may be made to the relevant descriptions in the embodiments of the above-mentioned shift register, and the repetition will not be described herein again.

According to the control method of the shift register provided by some embodiments of the present disclosure, in one frame time (e.g., the time of the first frame) of any two adjacent frames, the first power supply terminal outputs the first control voltage, the first clock signal and the first input signal are pulse signals, so that the first shift register unit operates, and in another frame time (e.g., the time of the second frame) of any two adjacent frames, the second power supply terminal outputs the second control voltage, the second clock signal and the second input signal are pulse signals, so that the second shift register unit operates, so that the first shift register unit and the second shift register unit alternately perform pixel driving, thereby achieving the driving timing required by a pixel circuit adopting two sets of driving designs and being easy to achieve.

In the description of this specification, the description of the terms "one embodiment," "some embodiments," "examples," "specific examples," or "some examples" and the like means that a specific feature, structure, material, or characteristic described in connection with the embodiment or example is included in at least one embodiment or example of the present disclosure. In this specification, the schematic representations of the above-mentioned terms do not necessarily refer to the same embodiment or example. Moreover, the specific features, structures, materials, or characteristics described may be combined in a suitable manner in any one or more embodiments or examples. In addition, those skilled in the art can combine different embodiments or examples described in this specification and features of different embodiments or examples without contradicting each other.

Furthermore, the terms "first" and "second" are used for descriptive purposes only and cannot be understood as indicating or implying relative importance or implicitly indicating the number of technical features indicated. Thus, features defining "first" and "second" may explicitly or implicitly include at least one of the features. In the description of the present disclosure, the meaning of "plural" is at least two, such as two, three, etc., unless otherwise specifically defined.

Any process or method description in the flowcharts or described in other ways here can be understood as representing a circuit, segment, or portion of code including one or more executable instructions for implementing customized logical functions or steps of the process, and the scope of preferred embodiments of the present disclosure includes additional implementations in which functions may be performed in a substantially simultaneous manner or in reverse order, other than in the order shown or discussed, according to the functions involved, and this should be understood by those skilled in the art to which embodiments of the present disclosure belong.

The logic and/or steps represented in the flowcharts or described in other ways here, for example, may be considered as a fixed sequence table of executable instructions for implementing logical functions, and may be embodied in any computer readable medium for use by or in connection with an instruction execution system, apparatus, or device (e.g., a computer-based system, a system including a processor, or other system that can fetch instructions from the instruction execution system, apparatus, or device, and execute the instructions). For the purposes of this specification, "computer readable medium" can be any device that can contain, store, communicate, propagate, or transport the program for use by or in connection with the instruction execution system, apparatus, or device. More specific examples (non-exhaustive list) of computer readable media include the following: an electrical connection component (electronic device) having one or more wires, a portable computer disk cartridge (magnetic device), a random access memory (RAM), a read only memory (ROM), an erasable editable read only memory (EPROM or flash memory), an optical fiber device, and a portable optical disk read only memory (CDROM). In addition, the computer readable medium may even be a paper or other suitable medium on which the program can be printed, because the program can be electronically obtained, for example, by optically scanning the paper or other medium, followed by editing, interpreting, or processing in other suitable ways if necessary, and then stored in a computer memory.

It should be understood that portions of the present disclosure may be implemented in hardware, software, firmware, or a combination thereof. In the above embodiments, the plurality of steps or methods may be implemented in software or firmware stored in a memory and executed by a suitable instruction execution system. For example, if implemented in hardware as in another embodiment, it can be implemented by any one or a combination of the following technologies known in the art: discrete logic circuits having logic gates for implementing logic functions on data signals, application specific integrated circuits having appropriate combinational logic gates, programmable gate arrays (PGA), field programmable gate arrays (FPGA), etc.

One of ordinary skill in the art can understand that all or part of the steps carried by the method for implementing the above embodiment can be completed by instructing relevant hardware through a program, and the program can be stored in a computer readable storage medium, and the program, when executed, includes one or a combination of the steps of the method embodiment.

In addition, each functional circuit in each embodiment of the present disclosure may be integrated into one processing circuit, or each circuit may be physically present separately, or two or more circuits may be integrated into one circuit.

The above integrated circuit can be implemented in the form of hardware or software functional circuits. If the integrated circuit is implemented in the form of a software functional circuit and sold or used as an independent product, it may also be stored in a computer readable storage medium.

The storage medium mentioned above may be read-only memory, magnetic disk or optical disk, etc. Although embodiments of the present disclosure have been shown and described above, it is to be understood that the above-mentioned embodiments are exemplary and should not be construed as limiting the present disclosure, and those of ordinary skill in the art may make changes, modifications, substitutions and variations to the above-mentioned embodiments within the scope of the present disclosure.

For the present disclosure, the following statements should be noted:

(1) The accompanying drawings involve only the structure(s) in connection with the embodiment(s) of the present disclosure, and other structure(s) can be referred to common design(s).

(2) For the purpose of clarity only, in accompanying drawings for illustrating the embodiment(s) of the present disclosure, the thickness and size of a layer or a structure may be enlarged. However, it should understood that, in the case in which a component or element such as a layer, film, area, substrate or the like is referred to be "on" or "under" another component or element, it may be directly on or under the another component or element or a component or element is interposed therebetween.

(3) In case of no conflict, the embodiments of the present disclosure or features in one embodiment or in different embodiments can be combined to obtain new embodiment(s).

What have been described above are only specific implementations of the present disclosure, the protection scope of the present disclosure is not limited thereto, and therefore, the protection scope of the present disclosure should be based on the protection scope of the claims.

What is claimed is:

1. A shift register, comprising a first shift register unit and a second shift register unit,
wherein the first shift register unit is electrically connected with a first node, a first signal input terminal, a first clock signal terminal and a first signal output terminal, the second shift register unit is electrically connected with the first node, a second clock signal terminal and a second signal output terminal;
the first shift register unit is configured to write a first control signal to the first node, and write a first clock signal provided by the first clock signal terminal to the first signal output terminal under control of a voltage of the first node;
the second shift register unit is configured to write a second clock signal provided by the second clock signal terminal to the second signal output terminal under control of the voltage of the first node;
during time of a frame, the first clock signal and a first input signal provided by the first signal input terminal are pulse signals, and the second clock signal is a DC signal.

2. The shift register according to claim 1, wherein the first shift register unit comprises a first input circuit and a first output circuit, the second shift register unit comprises a second output circuit, the first input circuit is respectively connected with the first signal input terminal and the first node, and the first input circuit is configured to write the first control signal to the first node;

the first output circuit is respectively connected with the first node, the first clock signal terminal and the first signal output terminal, and the first output circuit is configured to write the first clock signal to the first signal output terminal under control of the voltage of the first node; and the second output circuit is respectively connected with the first node, the second clock signal terminal and the second signal output terminal, and the second output circuit is configured to write the second clock signal to the second signal output terminal under control of the voltage of the first node.

3. The shift register according to claim 2, wherein the first shift register unit further comprises a first control circuit, the first control circuit is respectively connected with a first power supply terminal, the first node, a third power supply terminal and the first signal output terminal, and the first control circuit is configured to control a voltage of the first signal output terminal and the voltage of the first node under control of a first control voltage provided by the first power supply terminal.

4. The shift register according to claim 3, wherein the first control circuit comprises a first pull-down control circuit and a first pull-down circuit, the first pull-down control circuit is respectively connected with the first node and a second node, and is configured to control a level of the second node under control of the voltage of the first node, and the first pull-down circuit is respectively connected with the first node, the second node, the third power supply terminal and the first signal output terminal, and is configured to perform discharge process on the first node and the first signal output terminal under control of a voltage of the second node.

5. The shift register according to claim 4, wherein the first pull-down control circuit is further respectively connected with the first power supply terminal and the third power supply terminal, and the first pull-down control circuit is configured to write the first control voltage to the second node and to write a voltage of the third power supply terminal to the second node under control of the voltage of the first node.

6. The shift register according to claim 4, wherein the first control circuit further comprises a first reset circuit, the first reset circuit is respectively connected the third power supply terminal, and the first node, and the first reset circuit is configured to write a voltage of the third power supply terminal to the first node.

7. The shift register according to claim 4, wherein the first pull-down circuit is further connected with a third node and the second signal output terminal, and the first pull-down circuit is further configured to perform discharge process on the third node and the second signal output terminal under control of the voltage of the second node.

8. The shift register according to claim 3, wherein the second shift register unit further comprises a second control circuit, the second control circuit is respectively connected with a second power supply terminal, the first node, the third power supply terminal and the second signal output terminal, and the second control circuit is configured to control a voltage of the second signal output terminal and the voltage of the first node under control of a second control voltage provided by the second power supply terminal.

9. The shift register according to claim 8, wherein the second control circuit comprises a second pull-down control circuit and a second pull-down circuit, the second pull-down control circuit is respectively connected with the first node and a third node, and is configured to control a level of the third node under control of the voltage of the first node, the second pull-down circuit is respectively connected with the first node, the third node, the third power supply terminal, and the second signal output terminal, and is configured to perform discharge process on the first node and the second signal output terminal under control of a voltage of the third node.

10. The shift register according to claim 9, wherein the second control circuit further comprises a second reset circuit, the second reset circuit is respectively connected with the third powersupply terminal, and the first node, and the second reset circuit is configured to write a voltage of the third power supply terminal to the first node.

11. The shift register according to claim 9, wherein the second pull- down circuit is further connected with the second node and the first signal output terminal, and the second pull-down circuit is further configured to perform discharge process on the second node and the first signal output terminal under control of the voltage of the third node.

12. The shift register according to claim 2, wherein the first shift register unit further comprises a first control circuit, the second shift register unit further comprises a second control circuit, the first control circuit is respectively connected with a first power supply terminal, the first node, a third power supply terminal, and the first signal output terminal, and the first control circuit is configured to control a voltage of the first signal output terminal and the voltage of the first node under control of a first control voltage provided by the first power supply terminal;

the second control circuit is respectively connected with the first power supply terminal, the first node, the third power supply terminal, and the second signal output terminal, and the second control circuit is configured to control a voltage of the second signal output terminal and the voltage of the first node under control of the first control voltage provided by the first power supply terminal.

13. The shift register according to claim 12, wherein the first control circuit comprises a first pull-down control circuit, a first pull-down circuit, and a first reset circuit, the first pull-down control circuit is respectively connected with the first node and a second node, and is configured to control a level of the second node under control of the voltage of the first node;

the first pull-down circuit is respectively connected with the first node, the second node, the third power supply terminal, and the first signal output terminal, and is configured to perform discharge process on the first node and the first signal output terminal under control of a voltage of the second node; and the first reset circuit is respectively connected with the third power supply terminal, and the first node, and the first reset circuit is configured to write a voltage of the third power supply terminal to the first node;

the second control circuit comprises the first pull-down control circuit, the first pull-down circuit, and a second reset circuit, the first pull-down circuit is further connected with the second signal output terminal and is further configured to perform discharge process on the second signal output terminal under control of the voltage of the second node; and the second reset circuit is respectively connected with the third power supply terminal, and the first node, and the second reset circuit is configured to write the voltage of the third power supply terminal to the first node.

14. The shift register according to claim 2, wherein the first output circuit comprises a third transistor and a first capacitor, a first electrode of the third transistor is connected with the first clock signal terminal, a second electrode of the third transistor is connected with the first signal output terminal, a control electrode of the third transistor is connected with the first node, a first end of the first capacitor is connected with the first node, and a second end of the first capacitor is connected with the first signal output terminal; and the second output circuit comprises a fourth transistor and a second capacitor, a first electrode of the fourth transistor is connected with the second clock signal terminal, a second electrode of the fourth transistor is connected with the second signal output terminal, a control electrode of the fourth transistor is connected with the first node, a first end of the second capacitor is connected with the first node, and a second end of the second capacitor is connected with the second signal output terminal.

15. The shift register according to claim 4, wherein the first pull-down control circuit comprises a seventh transistor and an eighth transistor, a first electrode and a control electrode of the seventh transistor are connected with the first power supply terminal, a second electrode of the seventh transistor is connected with the second node, a first electrode of the eighth transistor is connected with the third power supply terminal, a second electrode of the eighth transistor is connected with the second node, and a control electrode of the eighth transistor is connected with the first node; and the first pull-down circuit comprises an eleventh transistor and a twelfth transistor, a first electrode of the eleventh transistor is connected with the first node, a second electrode of the eleventh transistor is connected with the third power supply terminal, a control electrode of the eleventh transistor is connected with the second node, a first electrode of the twelfth transistor is connected with the first signal output terminal, a second electrode of the twelfth transistor is connected with the third power supply terminal, and a control electrode of the twelfth transistor is connected with the second node.

16. The shift register according to claim 13, wherein the first pull-down circuit comprises a sixteenth transistor, a first electrode of the sixteenth transistor is connected with the second signal output terminal, a second electrode of the sixteenth transistor is connected with the third power supply terminal, and a control electrode of the sixteenth transistor is connected with the second node.

17. A gate drive circuit comprising a plurality of shift registers which are cascaded, wherein each of the plurality of shift registers comprises a first shift register unit and a second shift register unit, the first shift register unit is electrically connected with a first node, a first signal input terminal, a first clock signal terminal and a first signal output terminal, the second shift register unit is electrically connected with the first node, a second clock signal terminal and a second signal output terminal, the first shift register unit is configured to write a first control signal to the first node, and write a first clock signal provided by the first clock signal terminal to the first signal output terminal under control of a voltage of the first node;

the second shift register unit is configured to write a second clock signal provided by the second clock signal terminal to the second signal output terminal under control of the voltage of the first node;

during time of a frame, the first clock signal and a first input signal provided by the first signal input terminal are pulse signals, and the second clock signal is a DC signal.

18. The gate drive circuit according to claim 17, wherein the plurality of shift registers constitute a plurality of gate drive circuit groups, each gate drive circuit group comprises 2P shift registers, the 2P shift registers in each gate drive circuit group correspond to 2P clock signal groups, and two clock signals in each clock signal group are respectively provided to a first clock signal terminal and a second clock signal terminal of a corresponding shift register, in a case of P=1, a first signal input terminal of a j-th stage shift register is connected with a first signal output terminal of a (j−−1)-th stage shift register;

in a case where P is greater than 1, a first signal input terminal of a j-th stage shift register is connected with a first signal output terminal of a (j−P)-th stage shift register, wherein P is a positive integer and j is an integer greater than P.

19. A display device comprising the gate drive circuit according to claim 17.

20. A control method of a shift register, wherein the shift register comprises a first shift register unit and a second shift register unit, the first shift register unit is electrically connected with a first node, a first signal input terminal, a first clock signal terminal and a first signal output terminal, the second shift register unit is electrically connected with the first node, a second clock signal terminal and a second signal output terminal, the first shift register unit is configured to write a first ontro signal to the first node, and write a first clock signal provided by the first clock signal terminal to the first signal output terminal under control of a voltage of the first node;

the second shift register unit is configured to write a second clock signal provided by the second clock signal terminal to the second signal output terminal under control of the voltage of the first node;

during time of a frame, the first clock signal and a first input signal provided by the first signal input terminal are pulse signals, and the second clock signal is a DC signal, the control method comprises:

during the time of the frame, writing the first control signal to the first node through the first shift register unit, writing the first clock signal to the first signal output terminal through the first shift register unit under control of the voltage of the first node, and writing the second clock signal to the second signal output terminal through the second shift register unit under control of the voltage of the first node.

* * * * *

UNITED STATES PATENT AND TRADEMARK OFFICE
CERTIFICATE OF CORRECTION

| | | |
|---|---|---|
| PATENT NO. | : 11,645,969 B2 | Page 1 of 1 |
| APPLICATION NO. | : 17/809234 | |
| DATED | : May 9, 2023 | |
| INVENTOR(S) | : Zuquan Hu et al. | |

It is certified that error appears in the above-identified patent and that said Letters Patent is hereby corrected as shown below:

In the Claims

At Column 40, Claim 18, Line 32 last sentence should read:
"terminal of a (j-1)-th stage shift register"

Signed and Sealed this
Thirtieth Day of January, 2024

Katherine Kelly Vidal
*Director of the United States Patent and Trademark Office*